United States Patent
Aoki et al.

(10) Patent No.: US 11,988,929 B2
(45) Date of Patent: May 21, 2024

(54) ELECTRONIC DEVICE, METHOD OF MANUFACTURING SAME AND METHOD OF REPAIRING SAME

(71) Applicant: Trivale Technologies, Santa Clara, CA (US)

(72) Inventors: Masaru Aoki, Kumamoto (JP); Shigeaki Noumi, Kumamoto (JP); Katsuaki Murakami, Kumamoto (JP)

(73) Assignee: Trivale Technologies, Santa Clara, CA (US)

( * ) Notice: Subject to any disclaimer, the term of this patent is extended or adjusted under 35 U.S.C. 154(b) by 0 days.

(21) Appl. No.: 15/198,534

(22) Filed: Jun. 30, 2016

(65) Prior Publication Data

US 2017/0017131 A1 Jan. 19, 2017

(30) Foreign Application Priority Data

Jul. 17, 2015 (JP) .................................. 2015-142652

(51) Int. Cl.
*G02F 1/1362* (2006.01)
*G02F 1/1333* (2006.01)
(Continued)

(52) U.S. Cl.
CPC .... *G02F 1/136259* (2013.01); *H01L 27/1222* (2013.01); *H01L 27/1244* (2013.01);
(Continued)

(58) Field of Classification Search
CPC ............. H01L 27/1222; H01L 27/1244; H01L 27/1288; H01L 27/76669; H01L 27/1224;
(Continued)

(56) References Cited

U.S. PATENT DOCUMENTS 5,164,565 A * 11/1992 Addiego .............. B23K 26/032
219/121.6
6,180,516 B1 * 1/2001 Hsu ................... H01L 21/76808
257/E21.579

(Continued)

FOREIGN PATENT DOCUMENTS

JP 05-088191 A 4/1993
JP H10-003088 A 1/1998
(Continued)

OTHER PUBLICATIONS

An Office Action; "Notice of Reasons for Refusal," issued by the Japanese Patent Office dated Apr. 2, 2019, which corresponds to Japanese Patent Application No. 2015-142652 and is related to U.S. Appl. No. 15/198,534; with English language translation.

*Primary Examiner* — Dale E Page
*Assistant Examiner* — Quovaunda Jefferson
(74) *Attorney, Agent, or Firm* — Studebaker & Brackett PC

(57) ABSTRACT

There is provided a repair technique capable of repairing interconnect lines and the like in an electronic device with ease and with reliability and capable of suppressing the increase in the number of manufacturing steps associated with the repair to suppress the increase in manufacturing costs. The electronic device having a multi-layer interconnection structure includes: a foundation layer; a patterned interconnect line provided on the foundation layer; and an insulation film formed on the foundation layer and the interconnect line. The insulation film includes at least one thin film part in which at least part of the insulation film which lies on the interconnect line has a thickness less than that of its surroundings.

17 Claims, 42 Drawing Sheets

(51) Int. Cl.
*H01L 27/12* (2006.01)
*H01L 29/786* (2006.01)

(52) U.S. Cl.
CPC .... *H01L 27/1288* (2013.01); *H01L 29/78669* (2013.01); *G02F 1/133345* (2013.01); *G02F 1/136263* (2021.01)

(58) Field of Classification Search
CPC ........... H01L 27/11248; H01L 27/1259; H01L 29/78669; G02F 1/136259; G02F 1/133345; G02F 1/136263
See application file for complete search history.

(56) References Cited

U.S. PATENT DOCUMENTS

| | | | | |
|---|---|---|---|---|
| 6,762,802 | B2* | 7/2004 | Ono | G02F 1/136227 349/38 |
| 7,084,016 | B1* | 8/2006 | Yamazaki | H01L 21/0262 438/149 |
| 7,515,243 | B2* | 4/2009 | Watamura | H01L 27/124 349/192 |
| 2002/0050646 | A1* | 5/2002 | Ohhashi | H01L 23/5258 257/758 |
| 2002/0180926 | A1* | 12/2002 | Mizumura | C09K 19/322 349/172 |
| 2004/0033631 | A1* | 2/2004 | Clark | H01L 22/24 438/14 |
| 2005/0173701 | A1* | 8/2005 | Kawase | H01L 51/0022 257/40 |
| 2005/0190322 | A1* | 9/2005 | Okabe | C23F 1/20 349/113 |
| 2008/0054395 | A1 | 3/2008 | Akiyama et al. | |
| 2008/0206999 | A1* | 8/2008 | Imada | H01L 21/76825 438/694 |
| 2009/0015746 | A1* | 1/2009 | Te-Chen | G02F 1/136259 349/55 |

FOREIGN PATENT DOCUMENTS

| | | |
|---|---|---|
| JP | 11-190858 A | 7/1999 |
| JP | 2001-077202 A | 3/2001 |
| JP | 2004-103960 A | 4/2004 |
| JP | 2004-266224 A | 9/2004 |
| JP | 2005-173268 A | 6/2005 |
| JP | 2005-215455 A | 8/2005 |
| JP | 2008-060264 A | 3/2008 |

* cited by examiner

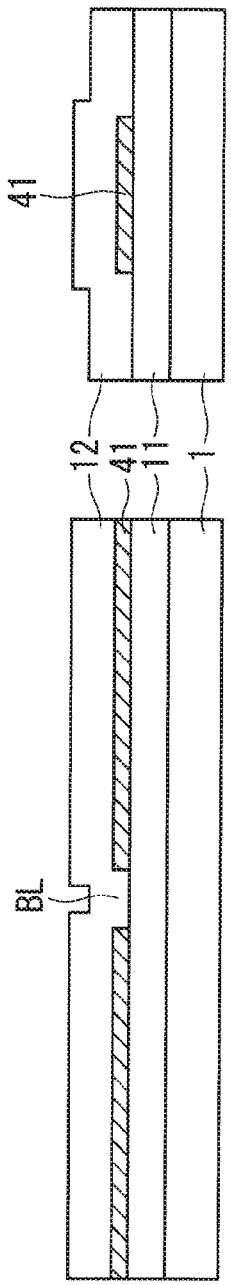

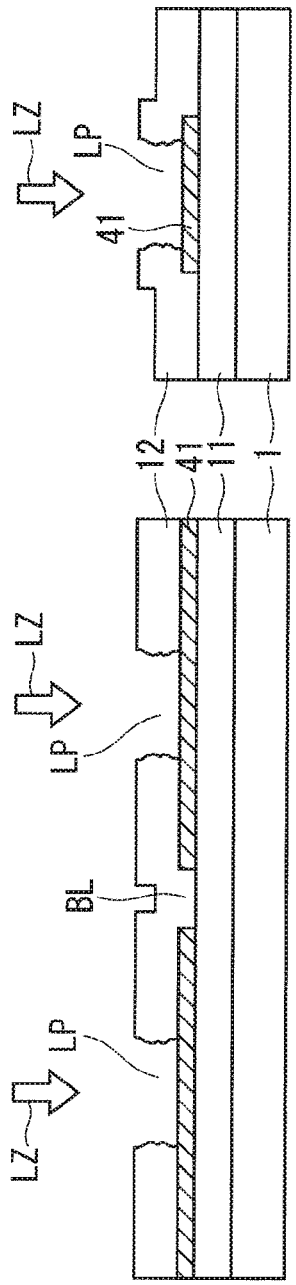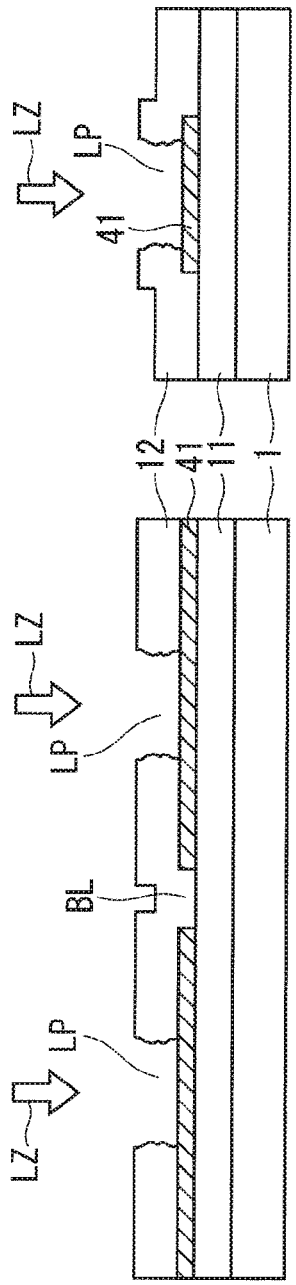

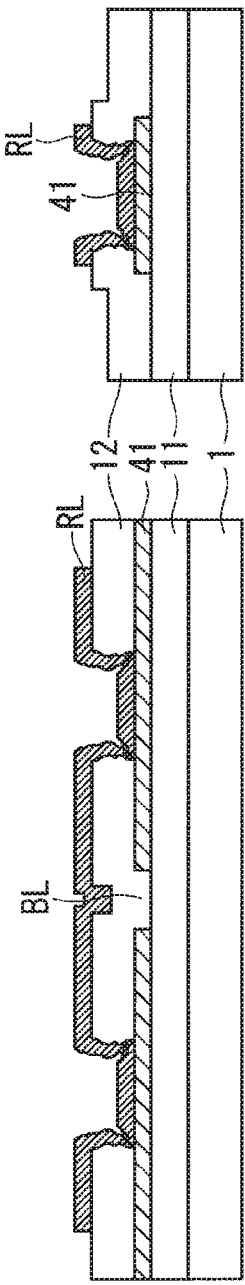

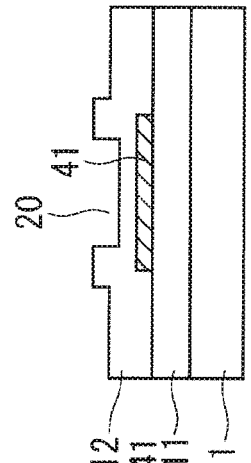
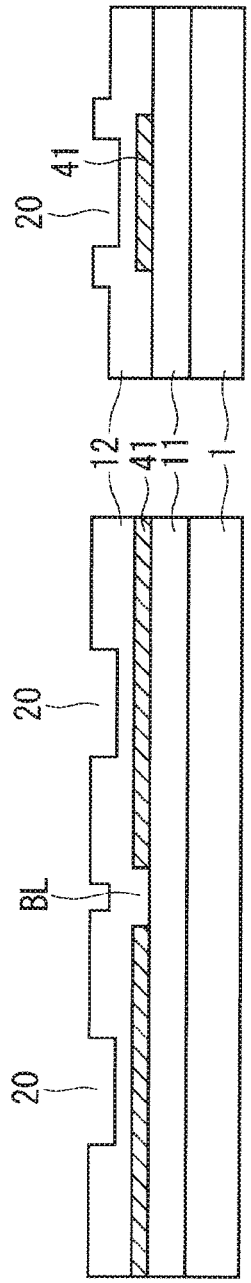

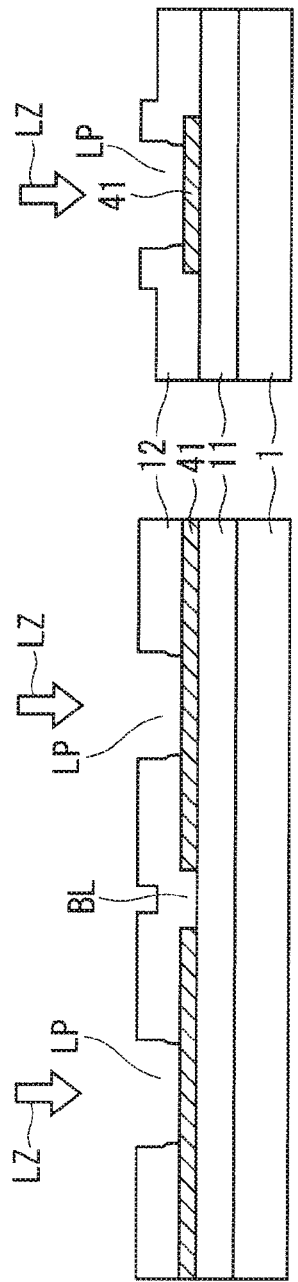

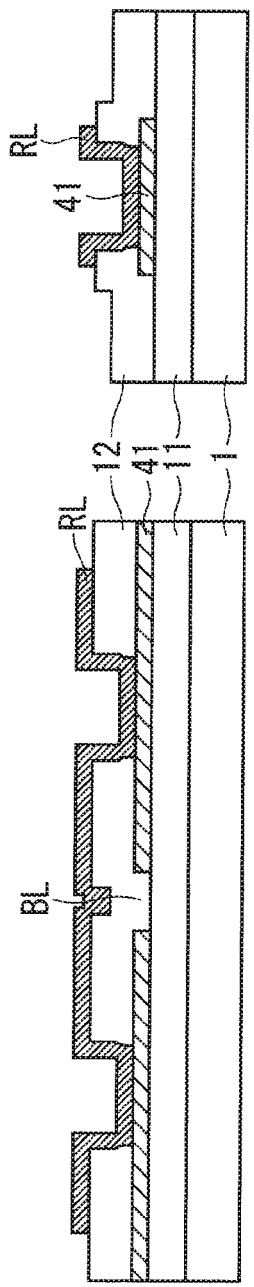

F I G. 3 0
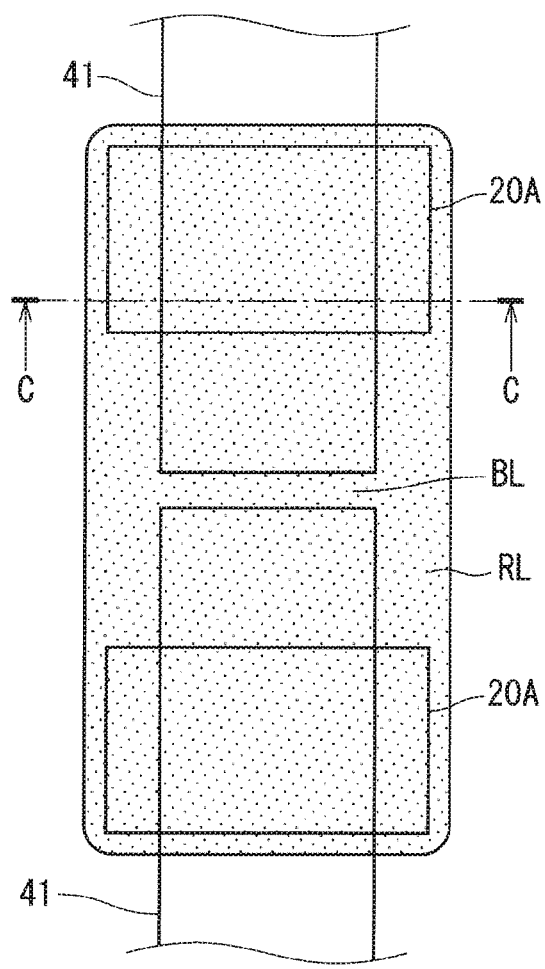

F I G. 3 2
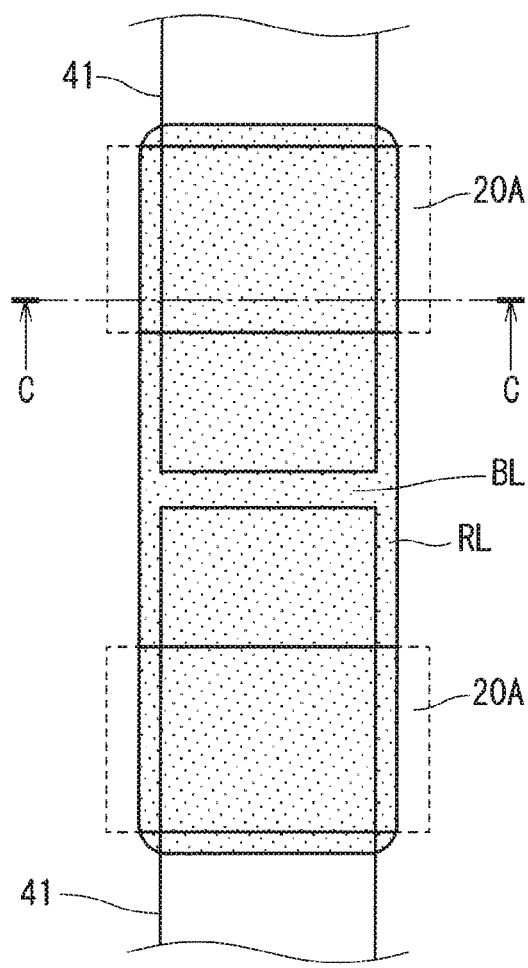

F I G. 3 4
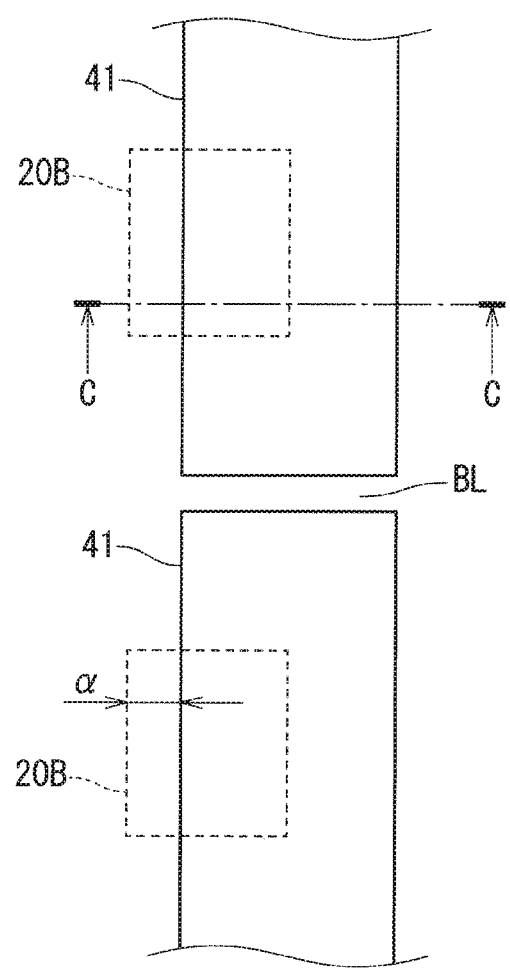

F I G. 3 8
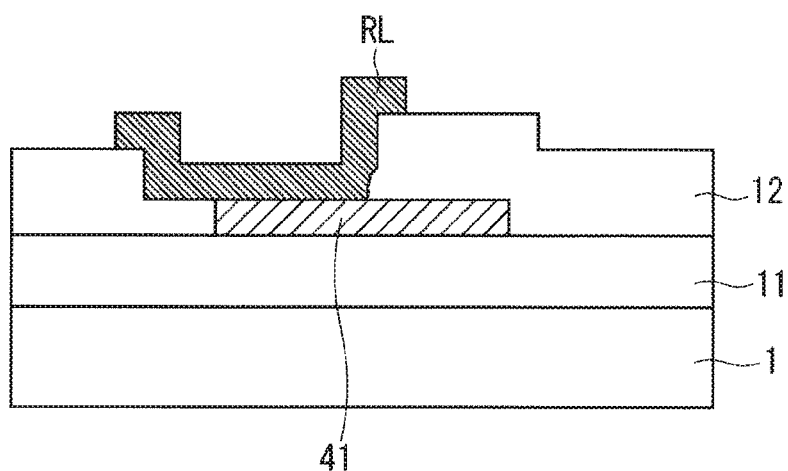

F I G. 5 0
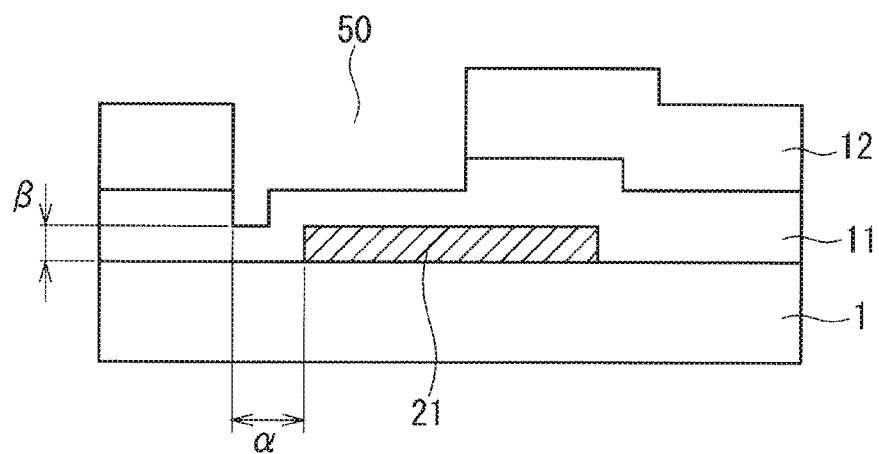
F I G. 5 1
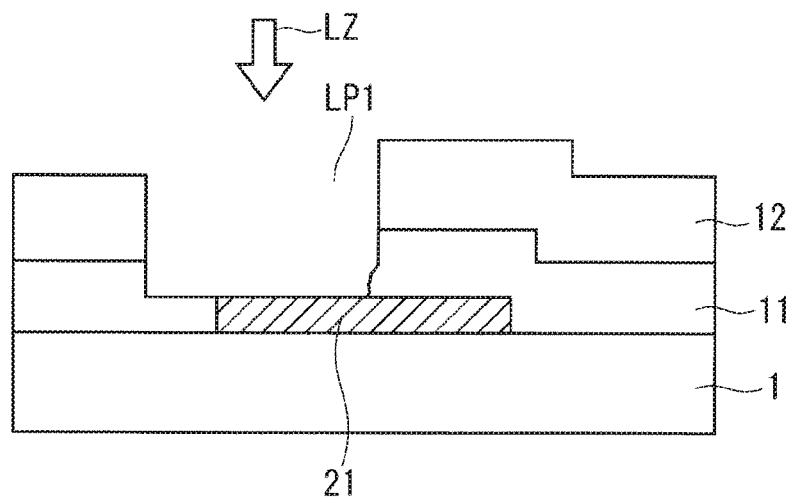

ELECTRONIC DEVICE, METHOD OF MANUFACTURING SAME AND METHOD OF REPAIRING SAME

BACKGROUND OF THE INVENTION

Field of the Invention

The present invention relates to an electronic device such as a liquid crystal display device and, more particularly, to an electronic device in which it is easy to repair interconnect lines and the like.

Description of the Background Art

A TN (Twisted Nematic) mode has been widely used as a display type of a liquid crystal display device which is one electronic device. However, a horizontal electric field type has recently been used in which voltage is applied between a pixel electrode and a counter electrode (common electrode) provided in opposed relation to the pixel electrode to generate a horizontal electric field in a panel surface, thereby causing the horizontal electric field to drive liquid crystal molecules in a horizontal direction.

The horizontal electric field type is advantageous to achieve a wide viewing angle, a high definition and a high brightness, and will be considered to be mainstream in devices having medium- and small-size panels which are typified by smartphones and tablet devices in the future.

Known examples of the horizontal electric field type include an IPS (In Plane Switching) type and an FFS (Fringe Field Switching) type (IPS is a registered trademark). In the FFS type, a lower electrode and an upper electrode having a slit are disposed, with an insulation film therebetween, and one of the lower and upper electrodes is used as a pixel electrode whereas the other electrode is used as a common electrode.

In the IPS type, display is performed by applying a horizontal electric field to a liquid crystal layer held between opposed substrates, and the pixel electrode and the common electrode to which the horizontal electric field is applied are provided in the same layer.

In the case where any one of the types is used, a liquid crystal layer is held between a pair of transparent substrates, and one of the pair of transparent substrates on the liquid crystal layer side has a TFT substrate including a plurality of scanning lines and a plurality of signal lines disposed in a matrix, with an insulation film therebetween, a thin film transistor (TFT) provided near each point of intersection of the scanning lines and the signal lines, and a pixel electrode to which a video signal is given through each of the signal lines. The turning on and off of the TFT are controlled by a scanning signal from each of the scanning lines, no that the supply of the video signal to the pixel electrode is controlled.

In recent years, there has been progress toward the smaller size and higher precision of display devices, and there has also been an increasing quality demand in the market. Failures of the display devices are based on a variety of factors. One example of such failures includes a line defect failure such that a partial break in the signal lines, the scanning lines and the electrodes due to foreign matter and the like in the manufacturing steps cuts off an electric signal to cause a linear defect on a display screen.

An effective means used to take measures against the line defect failure is what is called a "connection repair" such that a break is sensed in an inspection step and an electrically conductive metal deposition film is used to establish a short circuit connection across the broken part.

For example, disclosed in Japanese Patent Application Laid-Open No. 5-88191 (1993) is a technique in which a laser beam impinges upon two locations on either side of a broken part to partially remove an insulation film covering an interconnect line, thereby forming two contact holes extending through the insulation film. Then, an electrically conductive film is formed to extend over the two contact holes on either side of the broken part to establish an electrical short circuit across the broken part, thereby establishing electrical continuity.

Disclosed in Japanese Patent Application Laid-Open No. 11-190858 (1999) is a repair method in which contact holes exposing an interconnect line are previously provided in an insulation film covering the interconnect line, and in which, when the interconnect line is broken, an electrically conductive film is formed so as to extend over two of the contact holes on either side of the broken part to establish an electrical short circuit across the broken part, thereby carrying out repairs so that a predetermined signal is supplied through the electrically conductive film to a pixel electrode beyond the broken part.

When the metal film for repair is formed after the formation of the holes in the insulation film on the interconnect line with the laser and the like as disclosed in Japanese Patent Application Laid-Open No. 5-88191 (1993), there are cases in which the holes do not completely extend through the insulation film if laser power is insufficient because of variations in laser power. If laser power is excessive for the same reason, there are cases in which the surroundings and the underlying layer pattern are damaged or in which the coverage of the metal deposition film for repair formed thereon is decreased by the irregular cross-sectional shape of the holes, so that the connection repair cannot achieve sufficient electrical continuity. Also, there has been a problem such that the conduction path is narrow and incomplete although the repair is made apparently successfully, which in turn results in an insufficient repair success rate and insufficient connection reliability, such as the occurrence of a second break after shipment due to degradation with time.

In the repair method in which the contact holes for repair which expose the interconnect line are previously provided in the insulation film covering the interconnect line as disclosed in Japanese Patent Application Laid-Open No. 11-190858 (1999), it is necessary to previously form the contact holes for repair by a photolithography step and the like. This presents a problem in increasing the number of manufacturing steps to increase manufacturing costs. In addition, the repair can be made only in the case of trouble caused between the step of forming the contact holes for repair and the step of forming the overlying film. This presents a problem in decreasing the degree of flexibility in process design. Also, the contact holes for repair are present in other than the broken part, and the interconnect line is exposed in the corresponding parts. For this reason, when the contact holes for repair are provided in a liquid crystal display and the like for the purpose of repairing signal lines close to a liquid crystal layer such as source interconnect lines, current having a direct-current component flows in the liquid crystal. As a result, this presents a problem in giving rise to a display failure due to the degradation of the liquid crystal. When the insulation film is formed in the overlying layer after the repair of the broken part to avoid this problem, there arises another problem in increasing the number of manufacturing steps to increase manufacturing costs.

SUMMARY OF THE INVENTION

It is therefore an object of the present invention to provide a repair technique capable of repairing interconnect lines and the like in an electronic device with ease and with reliability and capable of suppressing the increase in the number of manufacturing steps associated with the repair to suppress the increase in manufacturing costs.

According to the present invention, an electronic device having a multi-layer interconnection structure includes: a foundation layer; a patterned interconnect line provided on the foundation layer; and an insulation film formed on the foundation layer and the interconnect line. The insulation film includes at least one thin film part in which at least part of the insulation film which lies on the interconnect line has a thickness less than that of its surroundings.

In the electronic device according to the present invention, the at least one thin film part is provided in the insulation film on the interconnect line. For the repair of the interconnect line, the insulation film to be removed is thin, so that removing laser power having relatively low energy is required for the removal. This shortens the time required for the repair to improve productivity. Also, only part of the insulation film corresponding to the area to be repaired is removed. The remaining part of the thin film part is covered with the insulation film on the interconnect line. This prevents the metal of the interconnect line to be exposed to prevent current having a direct-current component flowing through the interconnect line from exerting influence upon display characteristics.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3, 4, 5A, 5B, 6A, 6B, 7A and 7B are views illustrating a conventional repair method;

FIGS. 11A, 11B, 12A, 12B, 13A and 13B are views illustrating repair steps according to the first preferred embodiment of the present invention;

FIG. 30 is a view of the source interconnect line after repair according to the second preferred embodiment of the present invention;

FIG. 32 is a view of the source interconnect line after repair according to a modification of the second preferred embodiment of the present invention;

FIG. 34 is a view of the source interconnect line before repair according to a third preferred embodiment of the present invention;

FIG. 38 is a view illustrating the repair steps according to the third preferred embodiment of the present invention;

FIGS. 50 and 51 are views illustrating the repair steps according to the preferred embodiment of the present invention.

DESCRIPTION OF THE PREFERRED EMBODIMENTS

Introduction

Figure 1:
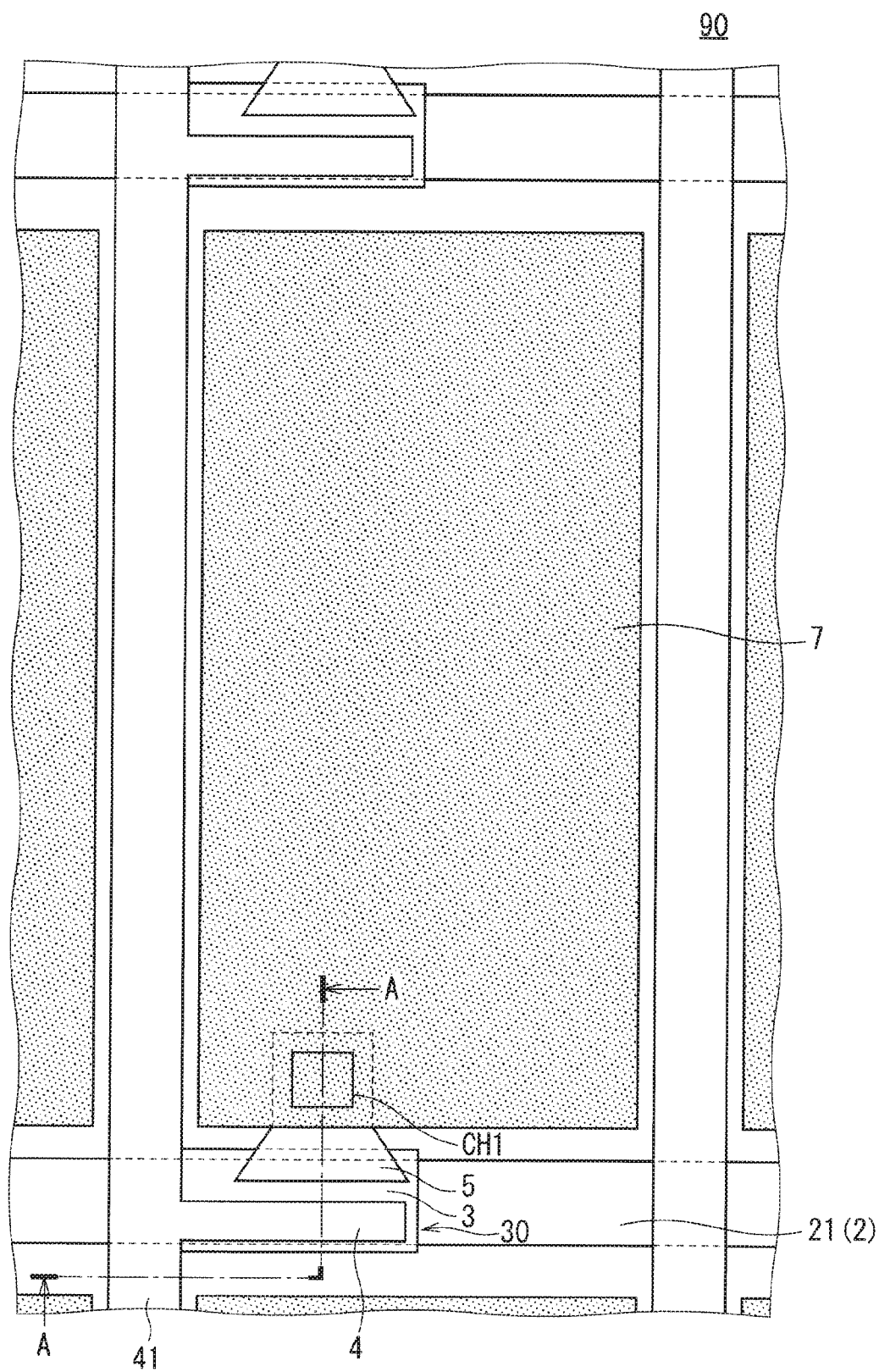
FIG. 1 is a plan view showing the configuration of one pixel part of a typical liquid crystal display panel.
Figure 2:
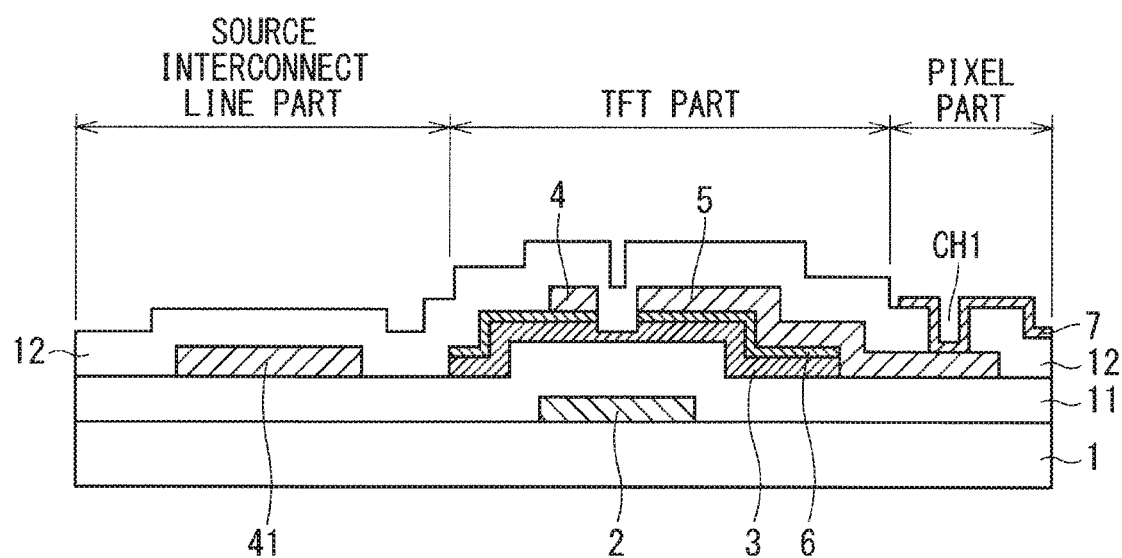
FIG. 2 is a sectional view showing the partial configuration of one pixel part of the typical liquid crystal display panel.

Prior to the description on preferred embodiments, a conventional repair method will be further described. FIG. 1 is a plan view showing the configuration of one pixel part of a typical TN (Twisted Nematic) type transmissive liquid crystal display panel 90, and shows the configuration of a TFT substrate side where thin film transistors (TFTs) 30 are arranged in a matrix. FIG. 2 is a view showing a cross-sectional configuration taken along the line A-A of FIG. 1.

The configuration of the liquid crystal display panel 90 will be described with reference to FIGS. 1 and 2. As shown in FIG. 1, the liquid crystal display panel 90 includes source interconnect lines 41 serving as signal lines and gate interconnect lines 21 serving as scanning lines. The source interconnect lines 41 intersect the gate interconnect lines 21 in orthogonal relation to each other. The TFTs 30 are provided near the respective intersections of the source interconnect lines 41 and the gate interconnect lines 21. Each of the TFTs 30 controls the supply of a display voltage so as to apply the display voltage based on an externally inputted video signal to a pixel electrode 7.

As shown in FIG. 2, such a TFT 30 includes a gate electrode 2 disposed on a transparent insulative substrate 1 made of glass and the like, a gate insulation film 11 covering, the gate electrode 2 from above, a semiconductor film 3 formed on the gate insulation film 11 over the gate electrode 2, an ohmic contact film 6 on the semiconductor film 3, and a source electrode 4 and a drain electrode 5 which are provided on the ohmic contact film 6 lying on the semiconductor film 3. An interlayer insulation film 12 is provided to cover the drain electrode 5. The pixel electrode 7 is provided on the interlayer insulation film 12. The pixel electrode 7 is electrically connected to the drain electrode 5 through a contact hole CH1.

As shown in FIG. 1, the source electrode 4 is provided in an orthogonal intersection part of a source interconnect line 41 and a gate interconnect line 21 so as to extend from the source interconnect line 41 in a direction orthogonal to the source interconnect line 41 to over the semiconductor film 3. The drain electrode 5 is positioned in opposed relation to the source electrode 4 as seen in plan view. The drain electrode 5 extends from over the semiconductor film 3 to under the pixel electrode 7.

The TFT 30 is provided over the gate interconnect line 21, and the gate interconnect line 21 serves as the gate electrode 2 thereof.

The pixel electrode 7 is formed to have such a size and a planar shape as to substantially cover a pixel region defined by the source and gate interconnect lines 41 and 21. A common electrode (not shown) is provided on a counter substrate side in vertically opposed relation to the pixel electrode 7, with a liquid crystal layer (not shown) therebetween. The common electrode is electrically connected to a common interconnect line (not shown) formed in the same layer as the gate interconnect lines 21.

Figure 3:
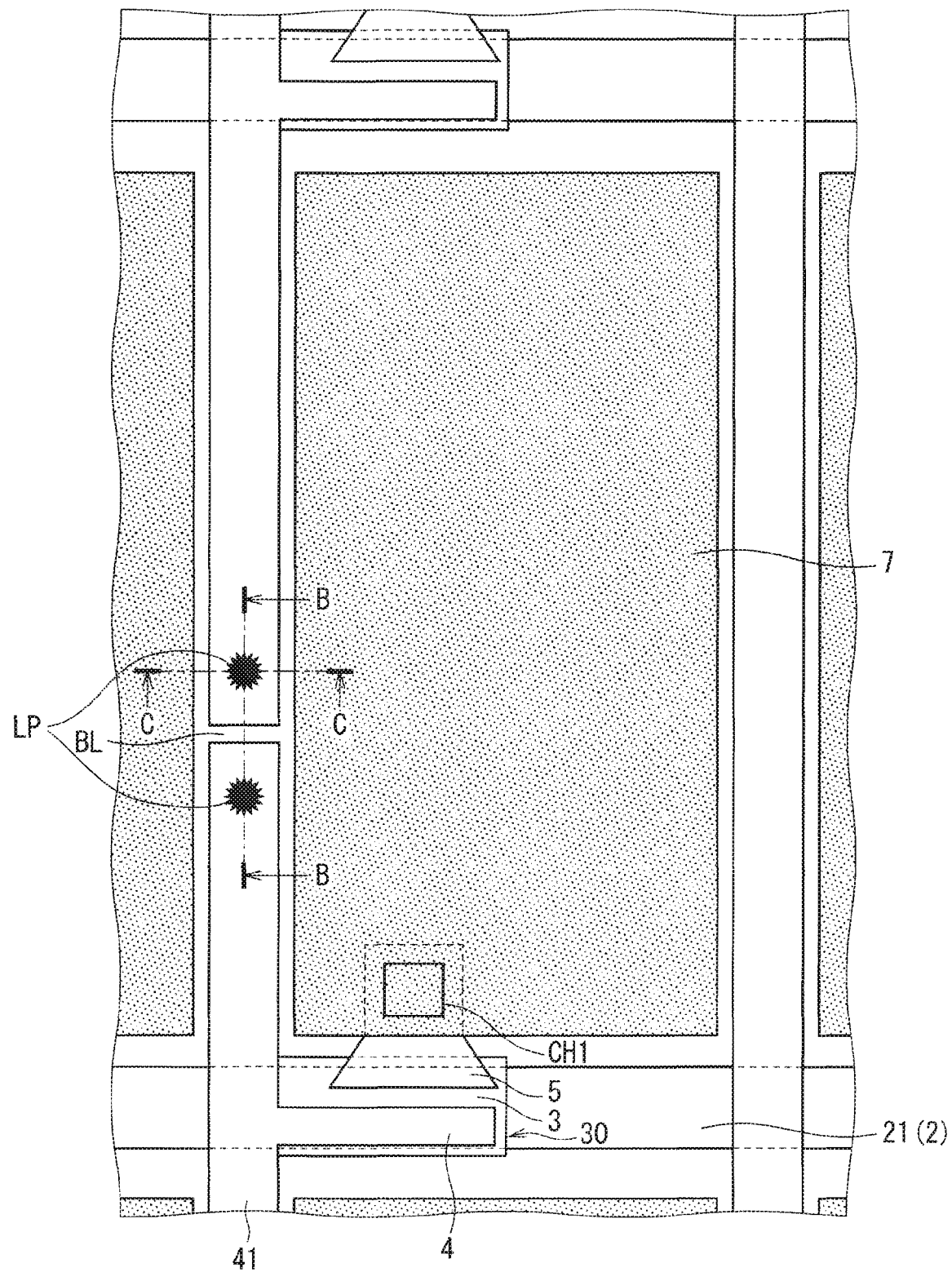
Figure 4:
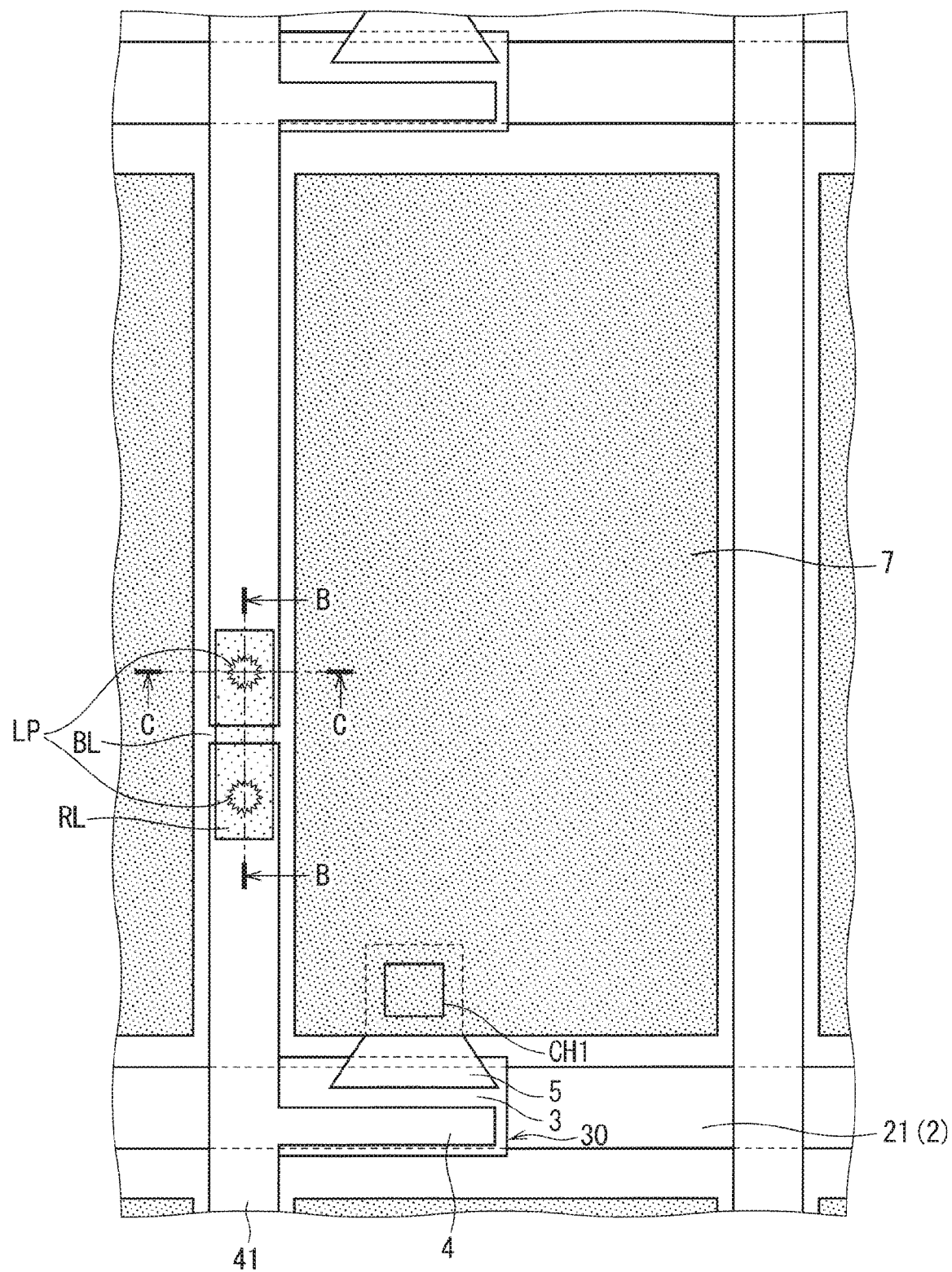

Next, a conventional repair method will be described with reference to FIGS. 3, 4, 5A, 5B, 6A, 68, 7A and 7B. FIG. 3 shows an example of break defects produced in a source interconnect line 41 in the liquid crystal display panel 90 shown in FIG. 1. As shown in FIG. 3, the source interconnect line 41 is broken in a broken part BL which is a defective part, so that an electric signal is not provided to the source electrode 4. In such a case, the interlayer insulation film on the source interconnect line 41 is irradiated with laser light at two locations on either side of the broken part BL. This removes the irradiated parts of the interlayer insulation film to form through holes LP extending to the source interconnect line 41. Then, as shown in FIG. 4, a repairing conductive film RL is formed to extend over the two through holes LP on either side of the broken part. BL, thereby establishing an electrical short circuit across the broken part BL.

Conventional repair steps will be described with reference to FIGS. 5A, 5B, 6A, 6B, 7A and 7B. FIGS. 5A, 6A and 7A show configurations corresponding to a cross-section taken along the line B-B of FIG. 4, and FIGS. 5B, 6B and 7B show configurations corresponding to a cross-section taken along the line CC of FIG. 4.

The source interconnect line 41 in which a break defect is produced is shown in FIGS. 5A and 5B. Next, in the step shown in FIGS. 6A and 6B, the interlayer insulation film 12 on the source interconnect line 41 is irradiated with laser light LZ at two locations on either side of the broken part BL. This removes the irradiated parts of the interlayer insulation film 12 to form the through holes LP extending to the source interconnect line 41 by a laser vaporization method (zapping method).

As shown in FIGS. 6A and 6B, there arise asperities on the inner surfaces of the through holes LP, so that the cross-sectional shape thereof is irregular. This is prone to occur pronouncedly when the laser light LZ has excessive power. Depending on the circumstances, there are cases in which the source interconnect line 41 has also asperities and breaks because of damages thereto. When the laser light LZ has insufficient power, on the other hand, the through holes LP are not completely formed through the interlayer insulation film 12. In the former case, there is a likelihood that breaks occur later due to degradation with time even when an electrical short circuit is established once across the broken part BL. In the latter case, an electrical short circuit is not established across the broken part BL even when the repairing conductive film RL is formed.

Next, in the step shown in FIGS. 7A and 7B, the repairing conductive film RL is formed to extend over the two through holes LP, thereby establishing an electrical short circuit across the broken part BL. However, the coverage of the repairing conductive film RL is poor because of the irregular cross-sectional shape of the through holes LP, which in turn results in a low degree of reliability.

First Preferred Embodiment

Device Configuration

Figure 8:
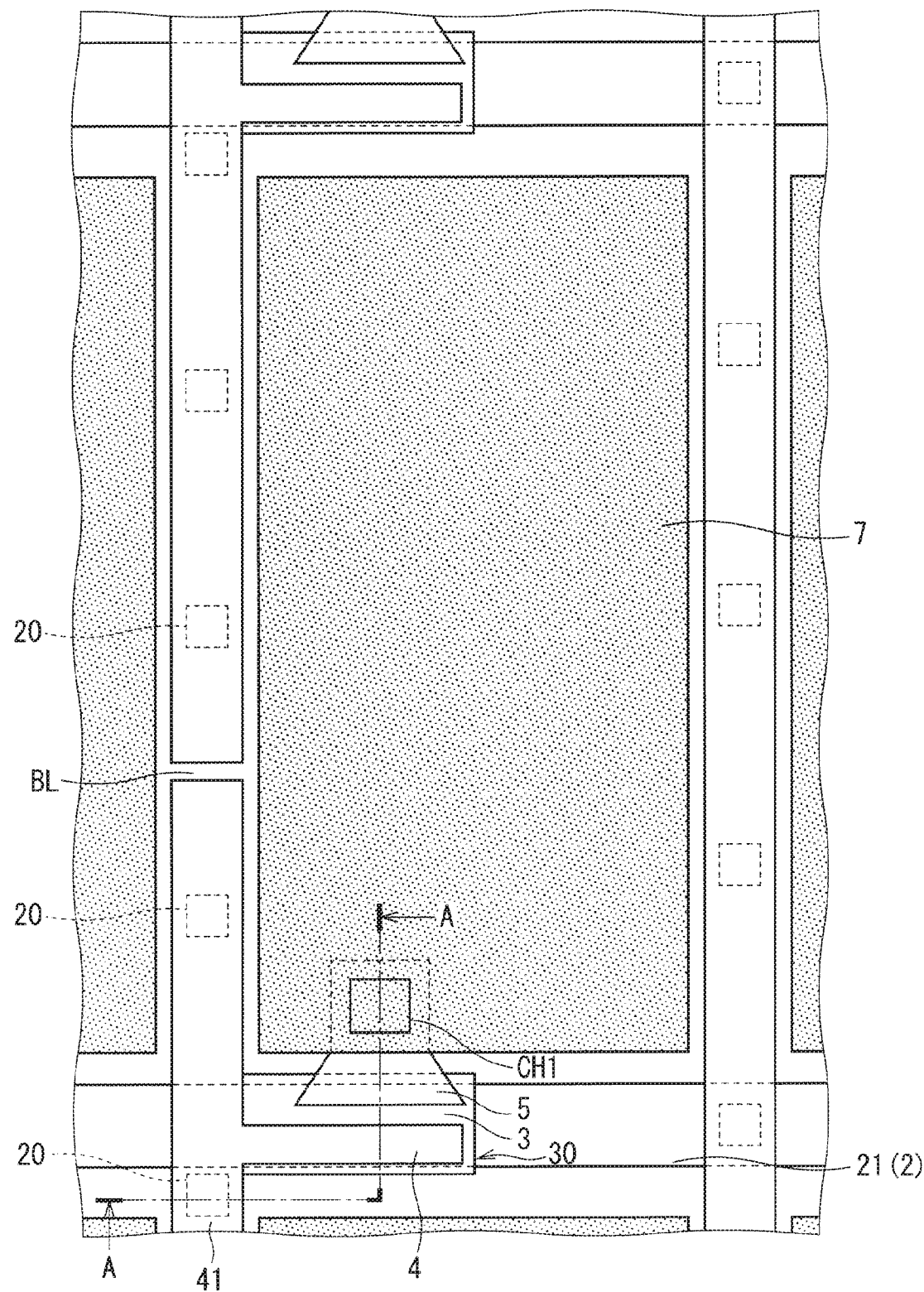
FIG. 8 is a plan view showing the configuration of one pixel part of a liquid crystal display panel according to a first preferred embodiment of the present invention.
Figure 9:
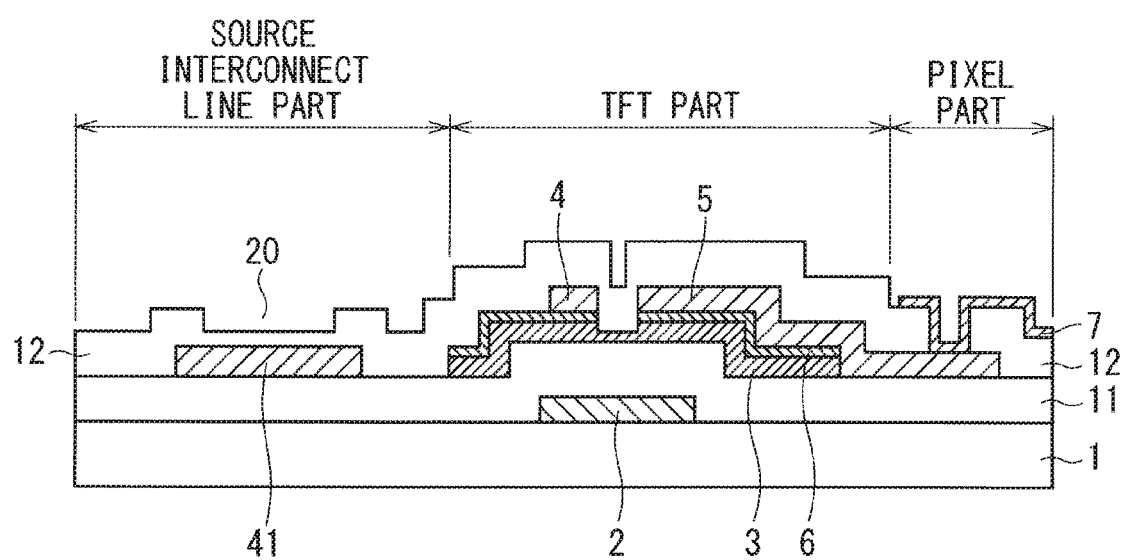
FIG. 9 is a sectional view showing the partial configuration of one pixel part of the liquid crystal display panel according to the first preferred embodiment of the present invention.

An electronic device according to a first preferred embodiment of the present invention will be described hereinafter. FIG. 8 is a plan view showing the configuration of one pixel part of a TN (Twisted Nematic) type transmissive liquid crystal display panel 100 according to the first preferred embodiment, and shows the configuration of the TFT substrate side where the TFTs 30 are arranged in a matrix. FIG. 9 is a sectional view showing a cross-sectional configuration taken along the line A-A of FIG. 8, and shows the cross-sectional configuration of a source interconnect line part, a TFT part, and a pixel part.

The configuration of the liquid crystal display panel 100 will be described with reference to FIGS. 8 and 9. The same reference numerals and characters are used in FIGS. 8 and 9 to designate components identical with those of the liquid crystal display panel 90 described with reference to FIGS. 1 and 2, and repetition in description is dispensed with.

As shown in FIG. 8, the liquid crystal display panel 100 further includes a plurality of repairing thin film parts 20 provided in the interlayer insulation film 12 (not shown) covering the source interconnect lines 41 along the source interconnect lines 41. An example of break defects produced in a source interconnect line 41 is shown in FIG. 8, and a broken part BL is formed. This is, however, for the illustration of the repair method according to the present invention, and is not the component of the present invention.

As shown in FIG. 9, such a repairing thin film part 20 is an area where the thickness of the interlayer insulation film 12 covering the source interconnect line 41 is partially less than that of other parts.

Figure 10:
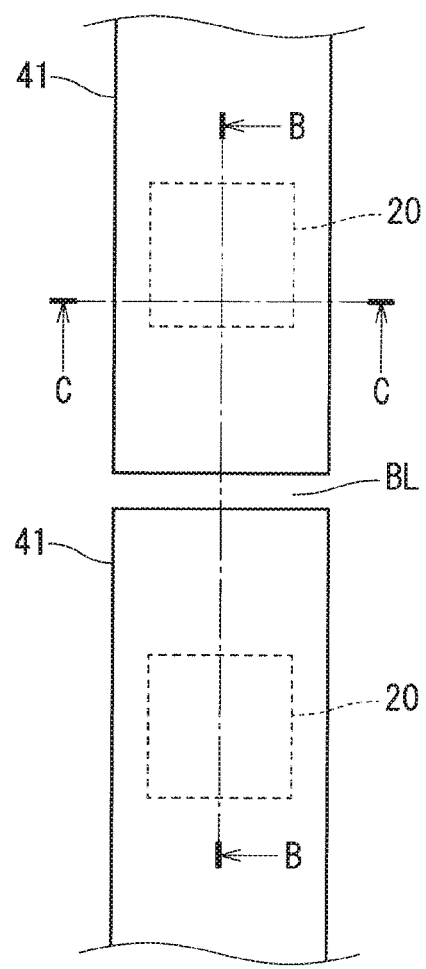
FIG. 10 is a view of a source interconnect line before repair according to the first preferred embodiment of the present invention.

FIG. 10 is an enlarged view of the source interconnect line 41 including two repairing thin film parts 20 on either side of the broken part BL of the source interconnect line 41 shown in FIG. 8 before repair. As shown in FIG. 10, the repairing thin film parts 20 are sized so as not to extend off the upper part of the source interconnect line 41, i.e., provided so that edges thereof extending in a direction orthogonal to the longitudinal direction of the source interconnect line 41 remain within two widthwise edges of the source interconnect line 41. In FIG. 10, the line B-B extending in the longitudinal direction of the source interconnect line 41 so as to pass over the two repairing thin film parts 20, and the line C-C traversing one of the repairing thin film parts 20 in the direction of the width of the interconnect line are additionally shown.

Next, repair steps according to the present invention will be described with reference to FIGS. 11A, 11B, 12A, 12B, 13A and 13B. FIGS. 11A, 12A and 13A show configurations corresponding to a cross-section taken along the line B-B of FIG. 10, and FIGS. 11B, 12B and 13B show configurations corresponding to a cross-section taken along the line C-C of FIG. 10.

As shown in FIGS. 11A and 11B, the two repairing thin film parts 20 are provided in the interlayer insulation film 12 on either side of the broken part BL. The broken part BL is shown in FIGS. 11A and 11B as produced midway between the two repairing thin film parts 20. This is, however, merely an example.

A configuration in which four repairing thin film parts 20 are provided for the source interconnect line 41 of one pixel is shown in FIGS. 11A and 11B. However, the number of repairing thin film parts 20 is not limited to this, but may be greater than four. The provision of a greater number of repairing thin film parts 20 makes it easier to cope with a break produced at any position in the interconnect line, and achieves a shorter formation path of the repairing conductive film, thereby improving the reliability of the repairing conductive film. In addition, this is more preferable because a shorter repairing time improves productivity. However, other effects remain unchanged when the formation path of the repairing conductive film becomes longer. Less than four repairing thin film parts 20 may be provided for each pixel. Alternatively, one repairing thin film part 20 may be provided for each pixel or for a plurality of pixels.

Next, in the step shown in FIGS. 12A and 12B, the repairing thin film parts 20 on the source interconnect line 41 is irradiated with the laser light LZ at two locations on either side of the broken part BL. This removes the interlayer insulation film 12 in the repairing thin film parts 20 to form the through holes LP extending to the source interconnect line 41 by the zapping method. A laser apparatus having a maximum output energy of greater than 0.5 µJ/pulse, for example, is used for the removal of the interlayer insulation film 12.

That is, a pulsed laser is used to remove the interlayer insulation film 12 while irradiation energy and time are controlled. Using a slit for setting an irradiation range, spots of laser light are set to have a size equal to or slightly greater than the size of the repairing thin film parts 20 as seen in plan view, e.g. on the order of 2×2 µm to 10×10 µm. The wavelength of laser light may be selected from among 266 nm, 355 nm, 532 nm and 1064 nm. However, laser light having a wavelength of 266 nm is often used.

In the repairing thin film parts 20, the interlayer insulation film 12 is reduced in thickness. This shortens the time required for the removal to improve productivity when the power of the laser light LZ is set to a lower energy than that of the conventional repair method.

Also, setting the power of the laser light LZ to a lower energy suppresses the asperities on the inner surfaces of the through holes LP as shown in FIGS. 12A and 12B to suppress the irregular cross-sectional shape of the through holes LP. This provides good coverage of the repairing conductive film RL to be formed next to prevent a narrow incomplete conduction path from resulting in the occurrence of a second break after shipment due to degradation with time, thereby improving a repair success rate and connection reliability.

The interlayer insulation film 12 is removed in the repairing thin film parts 20 only to be repaired. Thus, the remaining repairing thin film parts 20 are covered with the insulation film on the interconnect line, so that metal of the interconnect line is not exposed. In the case of a liquid crystal display, when the plurality of repairing thin film parts 20 are provided for the repair of signal lines close to the liquid crystal layer such as the source interconnect lines, current having a direct-current component does not flow in the liquid crystal. This prevents the degradation of the liquid crystal to prevent the impairment of the reliability and display quality of the display.

Figure 14:
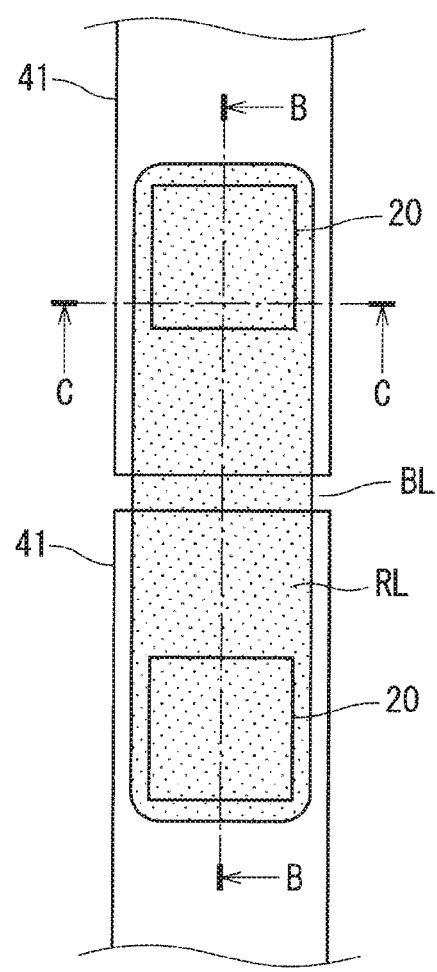
FIG. 14 is a view of the source interconnect line after repair according to the first preferred embodiment of the present invention.

Next, in the step shown in FIGS. 13A and 13B, the repairing conductive film RL is formed to extend over the two through holes LP, thereby establishing an electrical short circuit across the broken part BL. This provides a high degree of coverage of the repairing conductive film RL to provide a sufficiently high degree of reliability of the connection repair because the cross-sectional shape of the through holes LP is not irregular. A plan view corresponding to FIGS. 13A and 13B is shown in FIG. 14.

The repairing conductive film RL may be provided by depositing a metal film predominantly made of tungsten (W) excellent in electrical conductivity by means of a laser CVD (chemical vapor deposition) apparatus. For the deposition of the repairing conductive film RL, a continuous wave semiconductor laser (diode laser) apparatus is used as a laser light source, and third harmonics (351 nm) produced by wavelength conversion to one-third wavelength of the fundamental waves thereof are used. The continuous wave semiconductor laser (diode laser) apparatus used herein has a maximum average power output of not less than 2.0 mW (4 kHz).

For the formation of the repairing conductive film RL, a tungsten-containing carbonyl compound (for example, $W(CO)_6$) is used as a source gas and argon gas (Ar) is used as a carrier gas for the purpose of locally depositing tungsten.

More specifically, the tungsten-containing carbonyl compound is gasified, and the gasified tungsten-containing carbonyl compound is supplied to the part where the through holes LP are provided. This part is irradiated with laser light the size (width) of which is defined by a variable slit. Thus, the tungsten-containing carbonyl compound in the part irradiated with the laser light undergoes a photochemical reaction, so that a tungsten film is deposited and formed. The thickness of the tungsten film is controlled by the irradiation time of the laser light, and is in the range of 0.1 to 0.5 μm.

The tungsten-containing carbonyl compound is high in decomposition and deposition efficiencies by means of laser light and excellent in film formation stability. However, other source gases such as chromium carbonyl may be used. Thus, the repairing conductive film RL may be made of other metals such as chromium (Cr). Argon gas which is inert is preferably used as the carrier gas, but an inert gas such as nitrogen gas may be used as the carrier gas.

The width of the repairing conductive film RL may be selected as appropriate, for example, from the range of 1 to 25 μm by adjusting the width of the variable slit defining the size of the laser light and the energy level of the laser light. The thickness of the repairing conductive film RL nay be selected as appropriate, for example, from a range of not greater than 1.5 μm.

When laser CVD is used for the formation of the repairing conductive film RL, a laser processing apparatus including both the laser apparatus used for zapping and the laser apparatus used for laser CVD may be used. This allows the zapping and the formation of the repairing conductive film RL to be performed in succession, thereby achieving efficient operation.

The repairing thin film parts 20 are sized so as not to extend off the upper part of the source interconnect line 41. Thus, the bottom surfaces of the repairing contact holes formed in the repairing thin film parts 20 are defined only by the upper surface of the source interconnect lines 41 and therefore substantially planar. This provides good coverage of the repairing conductive film RL.

The method of formation of the repairing conductive film RL is not limited to the laser CVD. For example, the repairing conductive film RL may be formed by applying an electrically conductive paste (an organic solution containing a metal material) to extend over the two repairing thin film parts 20 and then heating the electrically conductive paste to dry the electrically conductive paste. The method of forming the repairing conductive film RL is not limited so long as an electrical short circuit is established across the broken part BL, and a conventional technique may be used for the formation of the repairing conductive film RL.

Manufacturing Method

Method of Manufacturing Liquid Crystal Display Panel

With reference to FIGS. 15 to 21 which are sectional views showing manufacturing steps in sequential order, description will be given on a method of manufacturing the liquid crystal display panel 100 including a method of manufacturing the repairing thin film parts. FIGS. 15 to 21 correspond to the sectional view shown in FIG. 9, and each show a cross-sectional configuration taken along the line A-A of FIG. 8.

Figure 15:
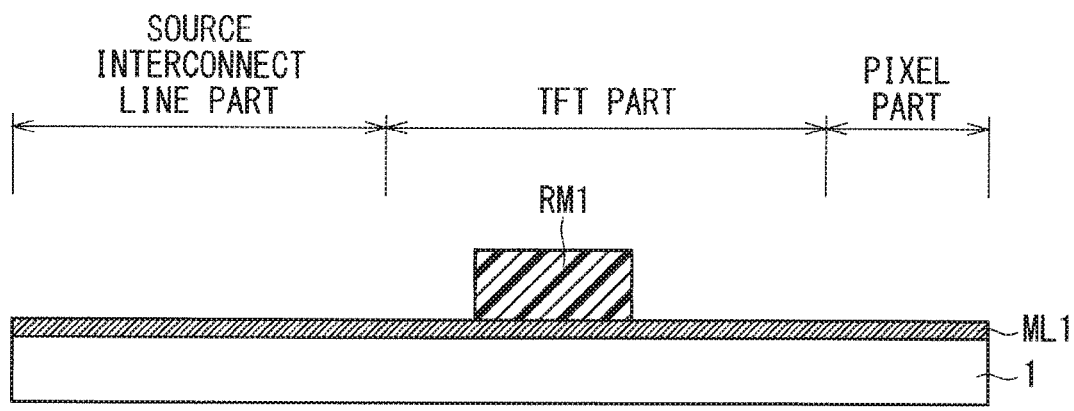
FIGS. 15 to 21 are views illustrating a method of manufacturing the liquid crystal display panel according to the first preferred embodiment of the present invention.

First, as shown in FIG. 15, the transparent insulative substrate 1 made of glass and the like is prepared. Thereafter, an AlNiNd film or an AlNiNdN film obtained by doping AlNiNd with N (nitrogen), for example, is formed as a first metal film ML1 on the entire upper surface of the transparent insulative substrate 1 serving as a foundation layer by a sputtering method to have a thickness on the order of 210 nm.

Next, a photoresist is applied onto the first metal film ML1. Thereafter, exposure to light and development e performed on the photoresist to form a resist pattern RM1 by patterning. These successive steps are referred to hereinafter as a photolithography step.

Figure 16:
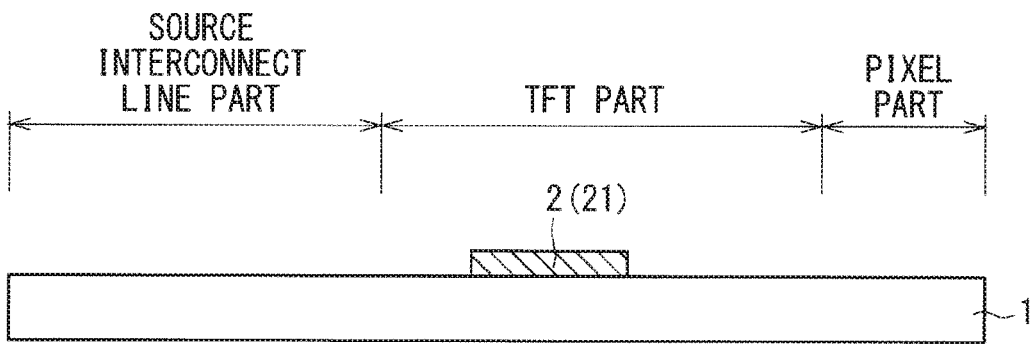

In this first photolithography step, the resist pattern RM1 for the patterning of the gate electrode 2 and the gate interconnect line 21 is formed. Thereafter, using the resist pattern RM1 as an etching mask, the first metal film ML1 is etched, and the resist pattern RM1 is then removed. This provides the gate electrode 2 and the gate interconnect line 21, as shown in FIG. 16. These successive steps are referred to hereinafter as an etching and resist removal step.

Figure 17:
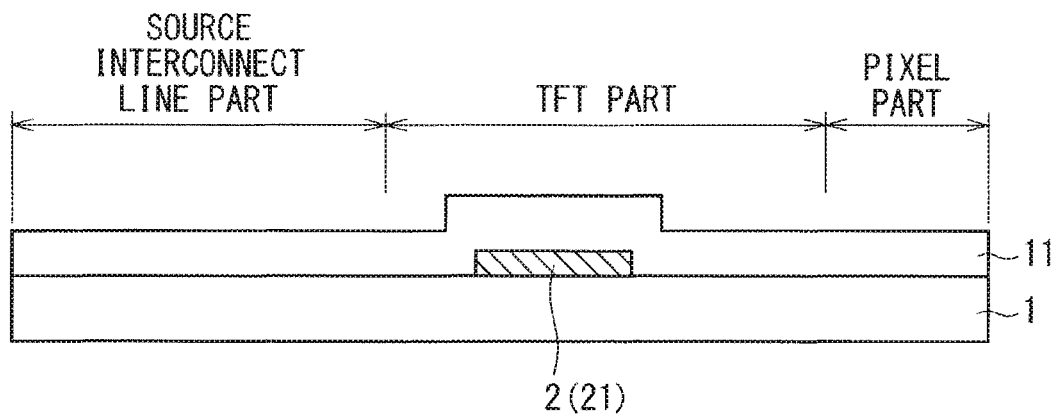

Next, in the step shown in FIG. 17, a silicon nitride (SiN) film having a thickness on the order of 400 nm is formed, for example, by a CVD method so as to cover the entire upper surface of the transparent insulative substrate 1. This provides the gate insulation film 11.

Next, a semiconductor film and an ohmic contact film are formed in the order named on the entire upper surface of the gate insulation film 11 serving as a foundation layer. A photoresist is applied onto the ohmic contact film. Thereafter, a photolithography step (second photolithography step) is performed to form a resist pattern (not shown).

The semiconductor film used herein is formed, for example, by a CVD method using an amorphous silicon (a-Si(i)) that is an intrinsic semiconductor to have a thickness on the order of 150 nm. The ohmic contact film used herein is formed, for example, by a CVD method using an amorphous silicon (a-Si(n)) doped with an N-type impurity to have a thickness on the order of 30 nm. Examples of the impurity used for doping include phosphorus (P) and arsenic (As).

Figure 18:
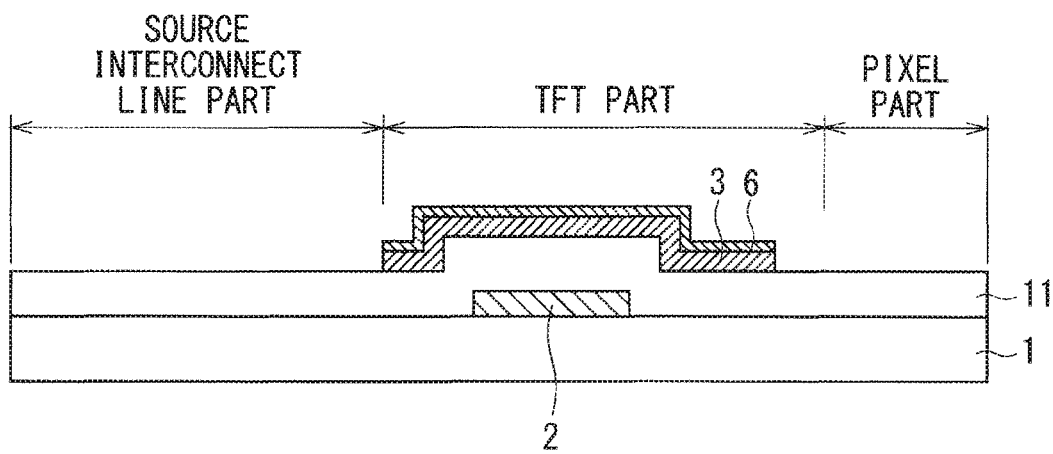

Thereafter, using the resist pattern as an etching mask, the ohmic contact film and the semiconductor film are etched, and the resist pattern is then removed. This provides a pattern such that the semiconductor film 3 and the ohmic contact film 6 are left only over the gate electrode 2 and its surroundings, as shown in FIG. 18.

Next, for example, a Cr film is formed as a second metal film over the entire upper surface of the gate insulation film 11 serving as a foundation layer by a sputtering method to have a thickness on the order of 200 nm. Then, a photoresist is applied onto the second metal film. Thereafter, a photolithography step (third photolithography step) is performed to form a resist pattern RM2.

Figure 19:
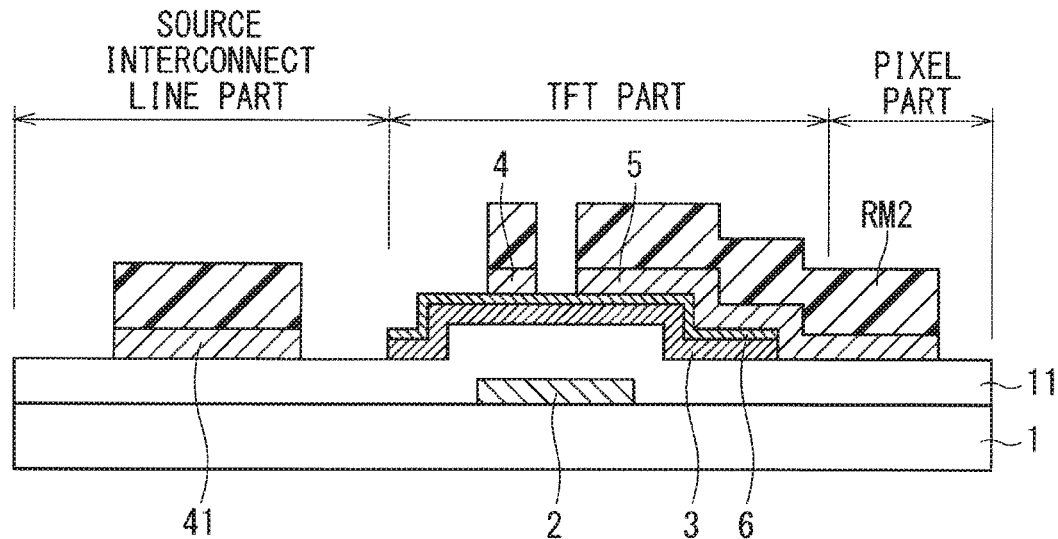

This resist pattern RM2 is a resist pattern for the patterning of the source electrode 4, the drain electrode 5 and the source interconnect line 41. Using the resist pattern RM2 as an etching mask, the second metal film is etched. This provides the source electrode 4, the drain electrode 5 and the source interconnect line 41, as shown in FIG. 19.

Figure 20:
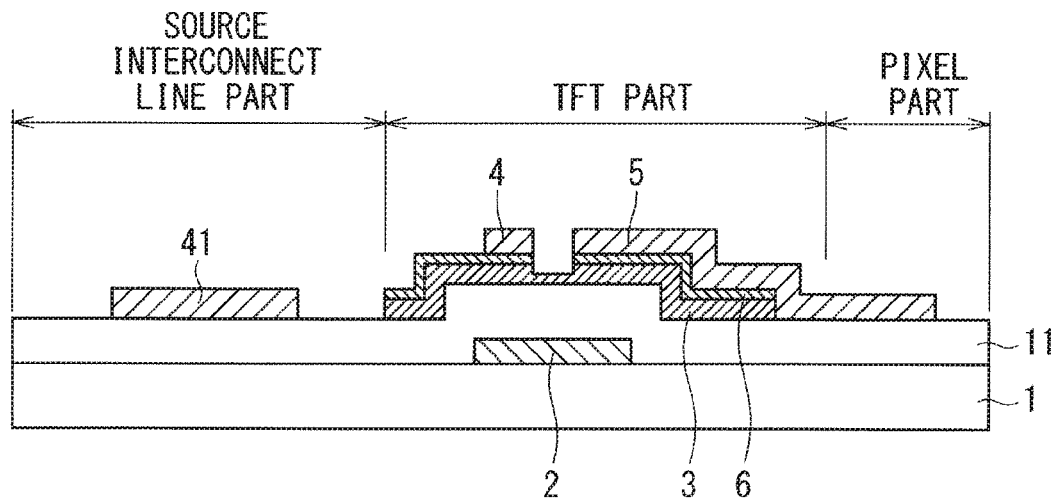

Further, using the resist pattern RM2, part of the ohmic contact film 6 which lies over a channel region is completely removed by etching, and the semiconductor film 3 is removed by etching to a predetermined depth. Then, the resist pattern RM2 is removed. Thus, the semiconductor film 3 in which the channel region is formed has a predetermined thickness, as shown in FIG. 20.

Figure 21:
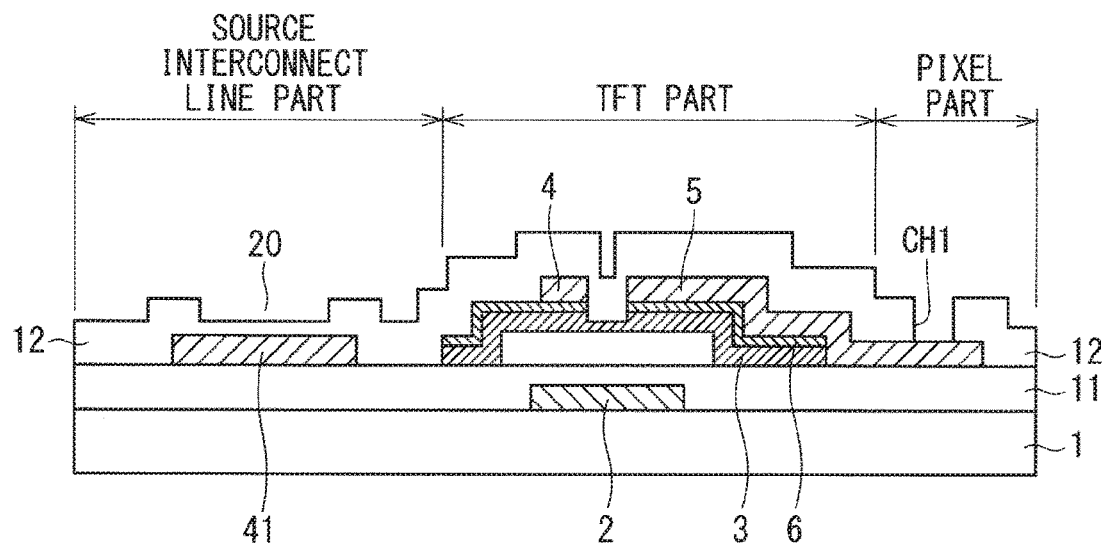

Next, a SiN film having a thickness on the order of 400 nm is formed, for example, by a CVD method so as to cover the entire upper surface of the transparent insulative substrate 1. This provides the interlayer insulation film 12. Thereafter, a photolithography step (fourth photolithography step) is performed to form a resist pattern (not shown). Using the resist pattern as an etching mask, the interlayer insulation film 12 is etched. The resist pattern is then removed. This provides the contact hole CH1 extending to the drain electrode 5 in the pixel part, and the repairing thin film part 20 over the source interconnect line 41, as shown in FIG. 21.

Next, a transparent conductive film, e.g. an ITO (Indium Tin Oxide) film, is formed over the entire upper surface of the transparent insulative substrate 1 by a sputtering method to have a thickness on the order of 80 nm. Thereafter, a photolithography step (fifth photolithography step) is performed to form a resist pattern (not shown). Using the resist pattern as an etching mask, the transparent conductive film is etched. The resist pattern is then removed. Thus, the pixel electrode 7 is patterned in the pixel part, so that a cross-sectional configuration shown in FIG. 9 is provided. The repair steps described with reference to FIGS. 11A, 11B, 12A, 12B, 13A and 13B may be performed in this stage.

Then, an alignment film is formed on the finished TFT substrate in a subsequent cell step. An alignment film is also formed on the counter substrate produced separately and having a counter electrode. Then, a technique such as rubbing is used to perform an aligning treatment which makes minute scratches in one direction on a contact surface with the liquid crystal on these alignment films.

Next, a seal material is applied to a peripheral part of the TFT substrate or the counter substrate to affix the TFT substrate and the counter substrate to each other in a predetermined spaced relation so that the alignment films thereof are opposed to each other. Thereafter, the liquid crystal is injected through a liquid crystal injection port by using a vacuum injection method and the like, and the liquid crystal injection port is sealed. Polarizing plates are affixed respectively to the opposite surfaces of the liquid crystal cell formed in this manner, and a driving circuit is connected to the liquid crystal cell. Then, a backlight unit is mounted. In this manner, a liquid crystal display device is finished.

Method of Forming Repairing Thin Film Part

Next, the method of forming the repairing thin film part 20 in the fourth photolithography step will be further described with reference to FIGS. 22 to 26.

In the fourth photolithography step, the interlayer insulation film 12 is formed so as to cover the entire upper surface of the transparent insulative substrate 1, and thereafter a resist is applied onto the interlayer insulation film 12. Then, prebaking is performed, and thereafter exposure to light is performed using a gray tone mask GM, as shown in FIG. 22.

Specifically, the gray tone mask GM has a gray tone pattern GT for the formation of the repairing thin film part 20 in the interlayer insulation film 12, and a full transmission pattern TP for the formation of the contact hole CH1 in the pixel part. The remainder of the gray tone mask GM is a light blocking film pattern LB.

The full transmission pattern TP is a transmissive part which fully transmits exposure light therethrough without decreasing the light intensity of the exposure light. The gray tone pattern GT is a semi transmissive part having a transmittance lower than that of the transmissive part, so that the light intensity after transmission therethrough is lower than that obtained by the full transmission pattern TP. The light blocking film pattern LB is a light blocking part which completely blocks the exposure light. Although not shown, the full transmission pattern TP is additionally formed in part of the gray tone pattern GT which corresponds to the formation of a contact hole extending to the common interconnect line formed in the same layer as the gate interconnect line 21. The common electrode and the common interconnect line are electrically connected to each other through this contact hole.

Figure 22:
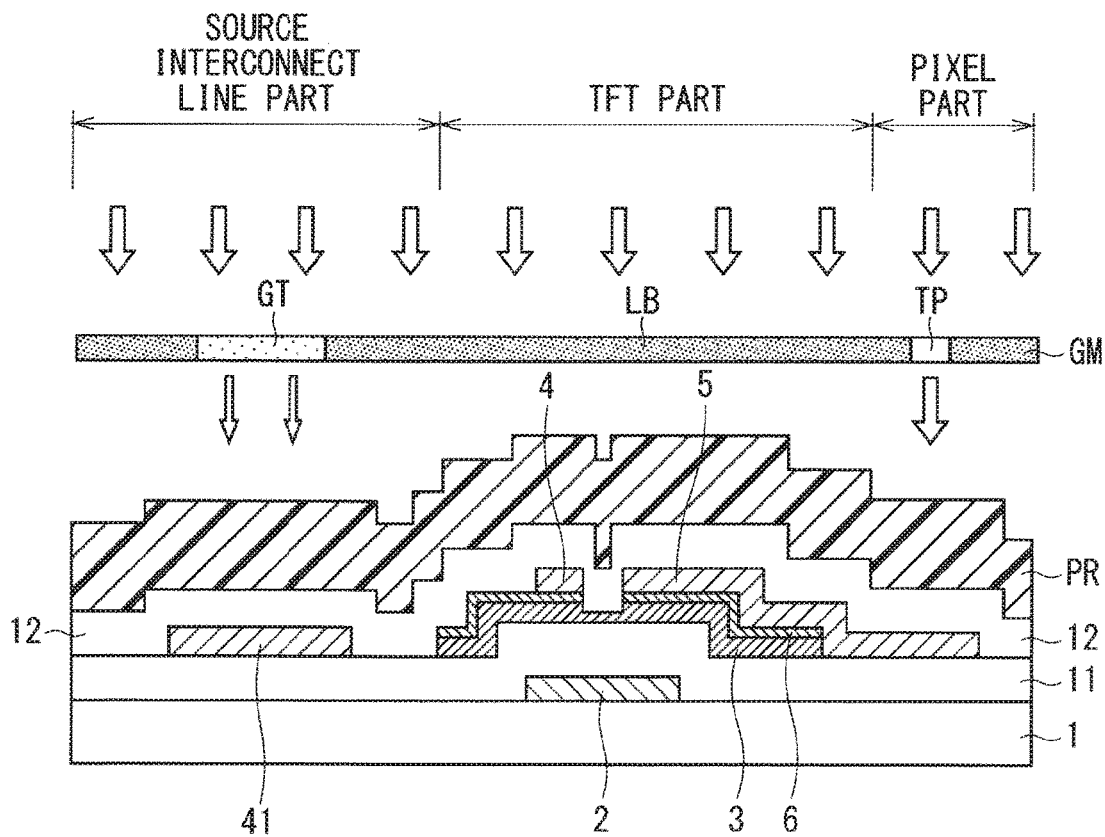
FIGS. 22 to 26 are views illustrating a method of forming a repairing thin film part.
Figure 23:
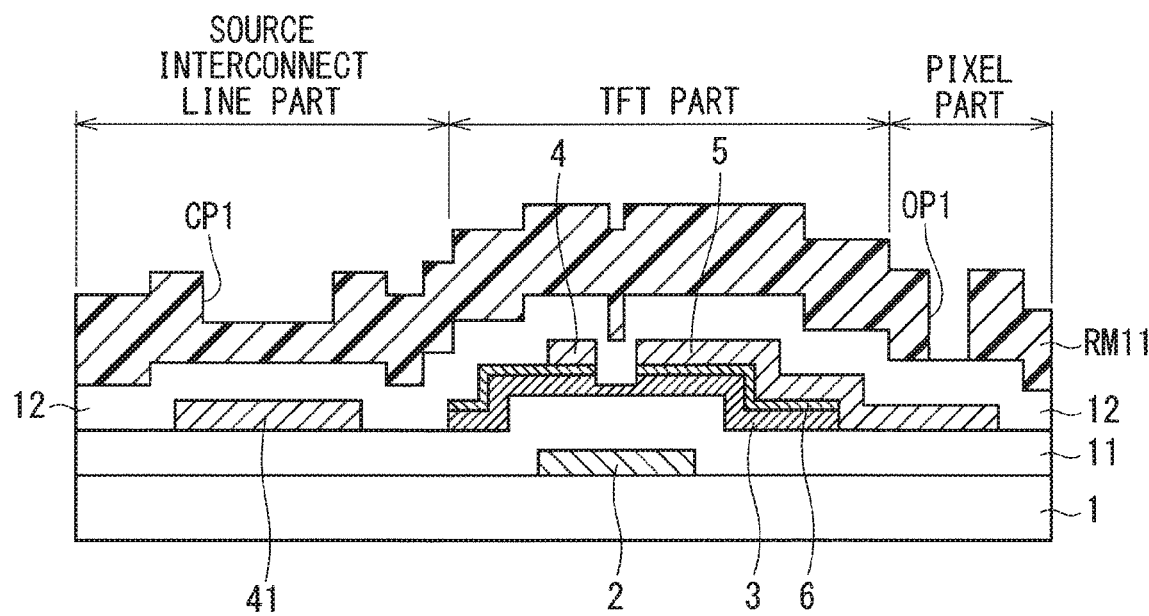

In the step shown in FIG. 22, a photoresist PR applied to and formed on the transparent insulative substrate 1 is exposed to light through the use of such a gray tone mask GM, and is developed, so that a resist pattern RM11 shown in FIG. 23 is formed by patterning. Specifically, the resist pattern RM11 has a recessed part CP1 which is a part exposed to light through the gray tone pattern GT to have a thickness less than that of an unexposed part of the resist film, and an opening part OP1 which is a part exposed to light through the full transmission pattern TP to be completely removed.

Figure 24:
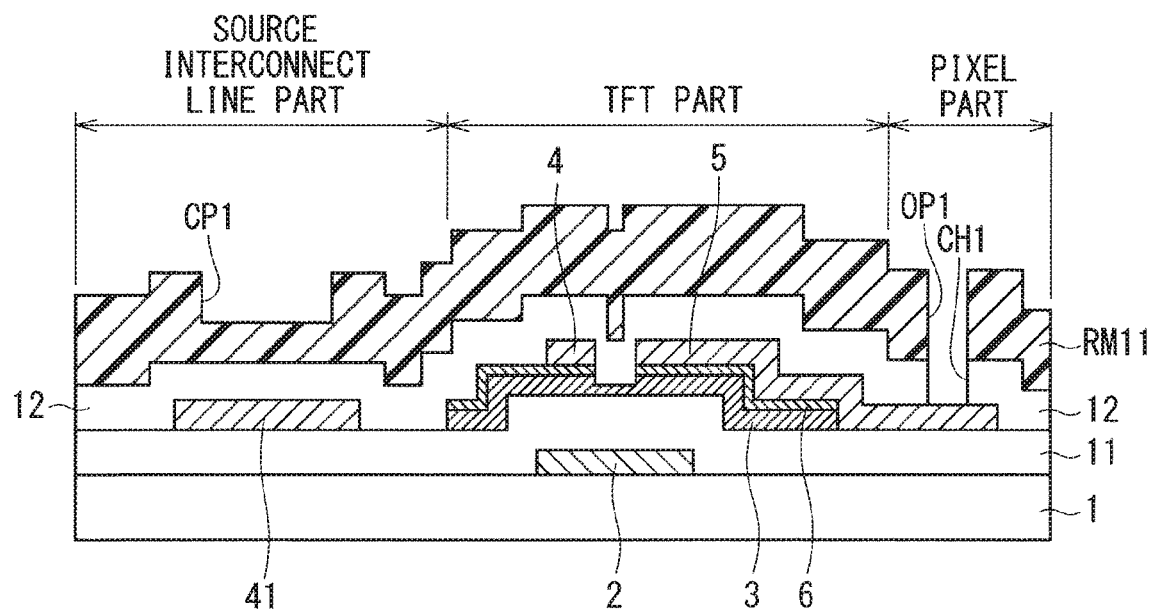

Next, in the step shown in FIG. 24, the interlayer insulation film 12 is dry etched using the resist pattern RM11 as an etching mask. As a result, the area where the opening part OP1 is provided is further etched, so that the contact hole CH1 extending to the drain electrode 5 is formed. In the area where the recessed part CP1 is provided, on the other hand, the interlayer insulation film 12 is not etched because the resist is left.

Figure 25:
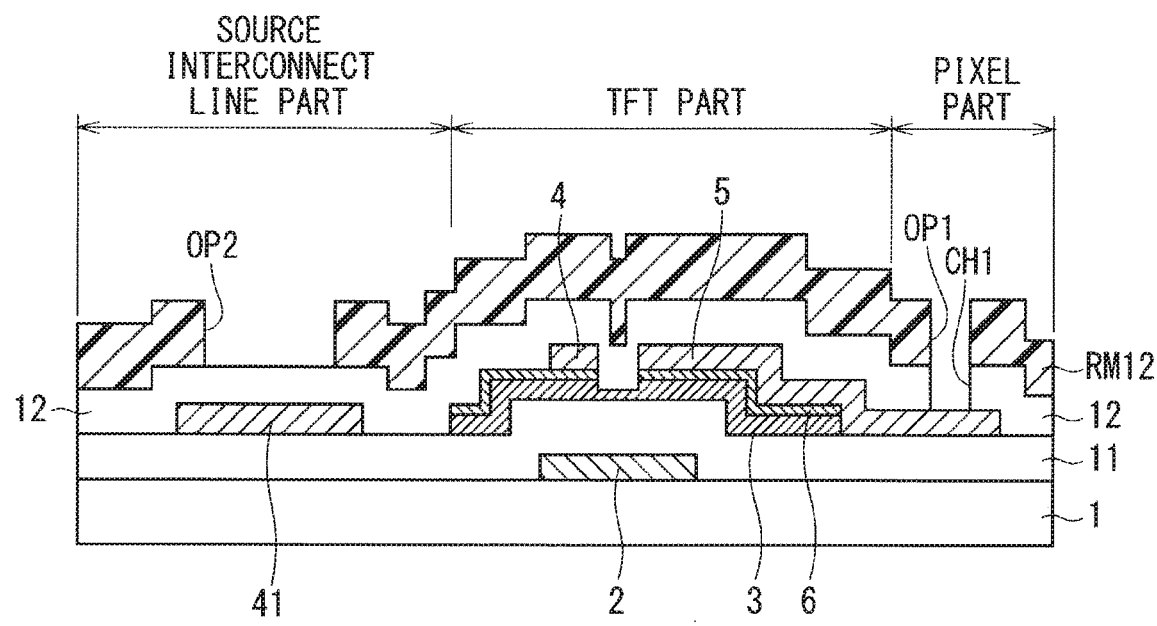

Next, in the step shown in FIG. 25, the thickness of the resist pattern RM11 is wholly decreased using $O_2$ ashing, so that the resist in the area where the recessed part CP1 is provided is completely removed. This provides a resist pattern RM12 in which the upper part of an area where the repairing thin film part 20 of the interlayer insulation film 12 is to be formed is an opening part OP2.

Figure 26:
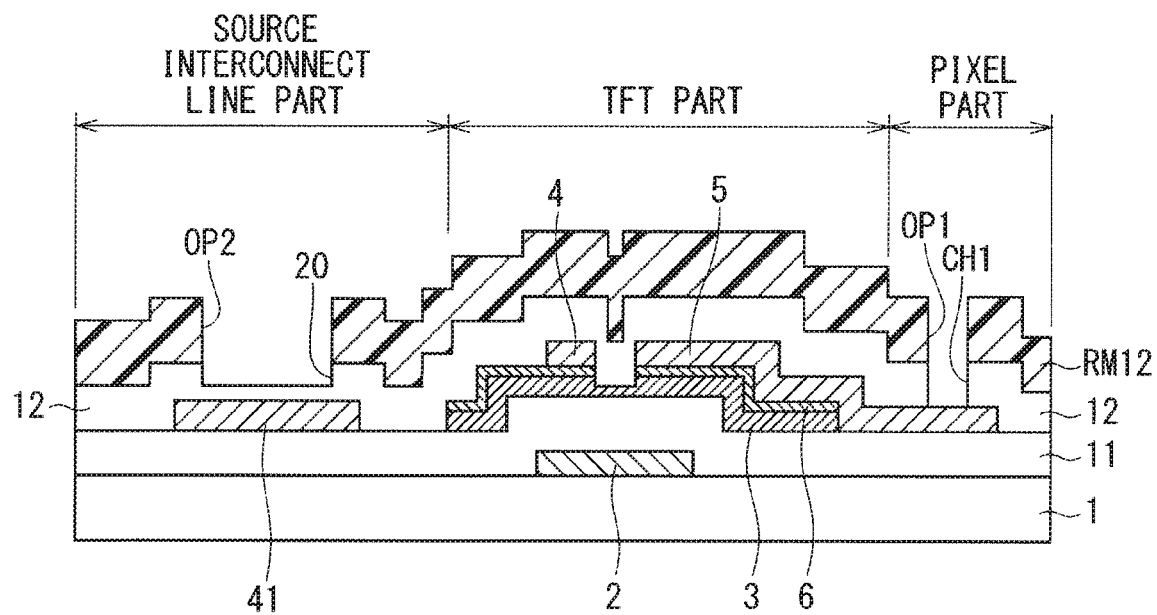

Next, in the step shown in FIG. 26, the interlayer insulation film 12 is dry etched using the resist pattern RM12 as an etching mask. As a result, the area where the opening part OP2 is provided is further etched, so that the repairing thin film part 20 in which the thickness of the interlayer insulation film 12 is less than that of the remaining area is formed. In this etching process, etching conditions and etching time are precisely managed so that the thickness of the interlayer insulation film 12 left in the area where the opening part OP2 is provided becomes a previously determined thickness. Finally, the resist pattern RM12 is removed. This provides the cross-sectional configuration shown in FIG. 21. The stepped part on the periphery of the repairing thin film part 20, which is formed by the lithography step and the etching step, has good coverage.

As described above, the resist is exposed to light through the use of the gray tone mask in the fourth photolithography step. This achieves the formation of the repairing thin film part 20 without the addition of a photolithography step to prevent the increase in manufacturing costs.

Second Preferred Embodiment

The electronic device according to a second preferred embodiment of the present invention will be described with reference to FIGS. 27 to 31. Only components different from those of the first preferred embodiment will be described, and the common components will not be described.

Figure 27:
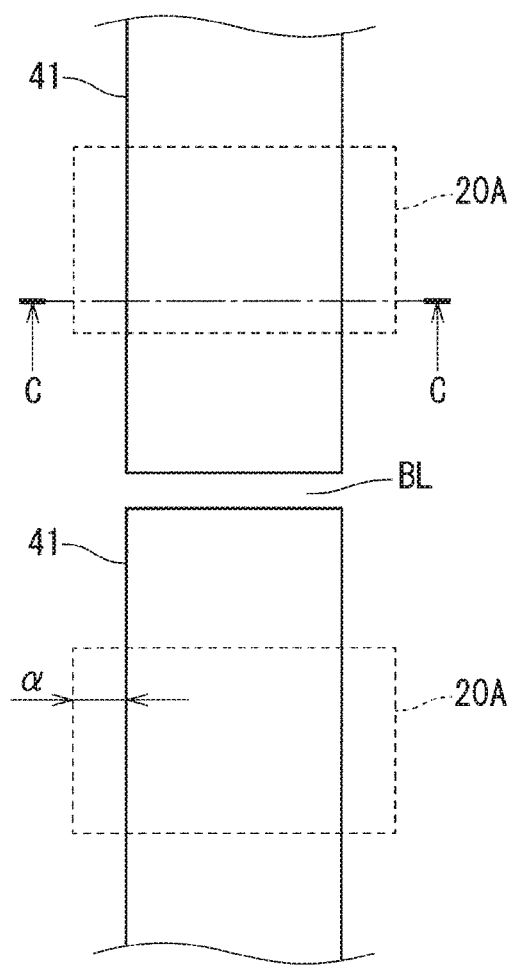
FIG. 27 is a view of the source interconnect line before repair according to a second preferred embodiment of the present invention.

FIG. 27 is an enlarged view of the source interconnect line 41 including two repairing thin film parts 20A on either side of the broken part BL of the source interconnect line 41 before repair. In FIG. 27, the line C-C traversing one of the repairing thin film parts 20A in the direction of the width of the interconnect line is additionally shown.

As shown in FIG. 27, the repairing thin film parts 20A are sized so as to extend off the upper part of the source interconnect line 41, i.e., sized so that edges thereof extending in a direction orthogonal to the longitudinal direction of the source interconnect line 41 overreach the two widthwise edges of the source interconnect line 41.

Parts of the repairing thin film parts 20A which overreach the widthwise edges of the source interconnect line 41 are referred to as extension parts. In FIG. 27, the length of the extension parts (the dimension of the direction of the width of the interconnect line) is shown as an extension length α. A cross-sectional configuration taken along the line C-C of FIG. 27 is shown in FIG. 8.

Figure 28:
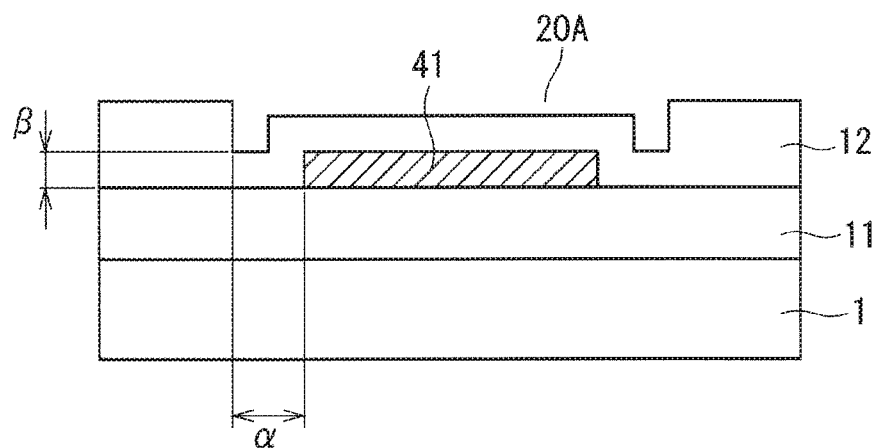
FIGS. 28 and 29 are views illustrating the repair steps according to the second preferred embodiment of the present invention.

In such a repairing thin film part 20A, the thickness of the interlayer insulation film 12 on the source interconnect line 41 is decreased, as shown in FIG. 28. The thickness of the interlayer insulation film 12 is similarly decreased as well in the extension parts. The stepped part on the periphery of the repairing thin film part 20A, which is formed by a lithography step and an etching step, has good coverage. The decreased thickness β of the interlayer insulation film 12 is approximately equal to the thickness of the source interconnect line 41. The reason therefor will be described below.

When the zapping method is used to remove part of the interlayer insulation film 12 which is irradiated with laser light, the laser light is reflected from the surface of a metal film, and the reflected laser light exerts an action. Thus, the laser power necessary and sufficient for the removal of the insulation film by breaking chemical bonds at the interface between the metal film and the insulation film is sufficiently lower than the laser power required to remove the insulation film in the absence of the metal film. For the removal of the insulation film left in the repairing thin film part 20A, the insulation film is therefore irradiated with laser light having laser power of a minimum level necessary and sufficient for the removal of the insulation film on the metal film.

This prevents a break resulting from damages to the metal film, i.e. the source interconnect line 41. In addition, the interlayer insulation film 12 in the area where the source interconnect line 41 is absent is little removed, whereas the interlayer insulation film 12 left on the source interconnect line 41 is removed to expose the source interconnect line 41. Thus, the upper surface of the interlayer insulation film 12 in the extension parts of the repairing thin film part 20A is substantially flush with the exposed upper surface of the source interconnect line 41.

Specifically, the thickness 11 of the interlayer insulation film 12 left in the extension parts is made approximately equal to the thickness of the source interconnect line 41 in consideration for the fact that the interlayer insulation film 12 in the area where the source interconnect line 41 is absent is little removed. This causes the upper surface of the interlayer insulation film 12 in the extension parts to be substantially flush with the upper surface of the source interconnect line 41 when the interlayer insulation film 12 left on the source interconnect line 41 is removed. This is the reason why the interlayer insulation film 12 is removed to a depth deeper than the upper part of the source interconnect line 41 in the extension parts and the thickness β of the left interlayer insulation film 12 is made approximately equal to the thickness of the source interconnect line 41.

Figure 29:
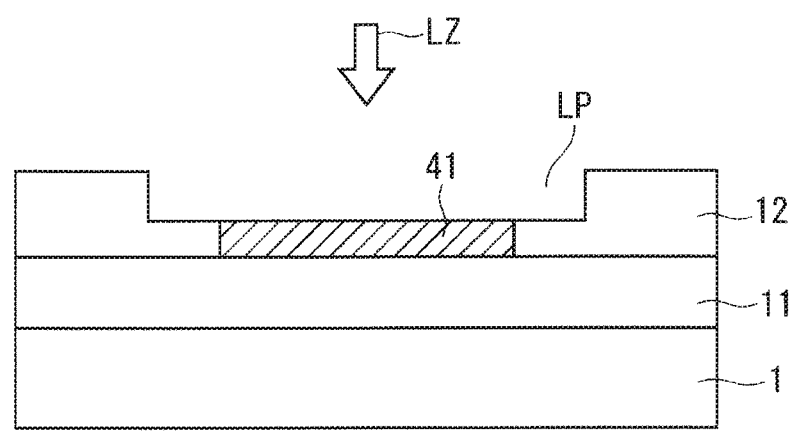

FIG. 29 is a sectional view showing that the source interconnect line 41 is exposed in the bottom of the through hole LP obtained by removing the interlayer insulation film 12 in the repairing thin film part 20A by the zapping method. As shown in FIG. 29, the upper surface of the interlayer insulation film 12 in the extension parts of the repairing thin film part 20A and the upper surface of the source interconnect line 41 are substantially flush with each other in the bottom surface of the through hole LP.

It is desirable that the extension length α of the extension parts of the repairing thin film part 20A is not less than the thickness of the interlayer insulation film 12 which is not yet decreased. When the extension length α is less than the thickness of the interlayer insulation film 12 which is not yet decreased, there is a likelihood that the upper surface of the interlayer insulation film 12 in the extension parts and the upper surface of the source interconnect line 41 are not substantially flush with each other near the edges of the source interconnect line 41, i.e. the underlying metal film to be repaired, as seen in the direction of the width of the interconnect line, which is not preferable. By making the extension length a not less than the thickness of the interlayer insulation film 12 which is not yet decreased, the upper surface of the interlayer insulation film 12 in the extension parts and the upper surface of the source interconnect line 41 are made substantially flush with each other, which is preferable.

Figure 31:
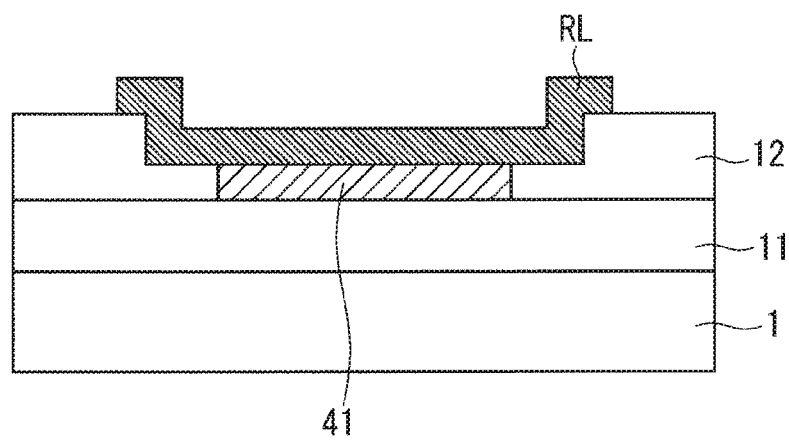
FIG. 31 is a view illustrating the repair steps according to the second preferred embodiment of the present invention.

After planarization in the repairing thin film parts 20A, the repairing conductive film RL predominantly made of tungsten excellent in electrical conductivity is formed, as shown in FIG. 30, by means of a laser CVD apparatus so as to extend over the two repairing thin film parts 20A on either side of the broken part BL as in the first preferred embodiment. In this case, the repairing conductive film RL is deposited so as to cover all of the two repairing thin film parts 20A. A cross-sectional configuration taken along the line C-C of FIG. 30 is shown in FIG. 31.

As described above, the repairing thin film parts 20A in the electronic device according to the second preferred embodiment of the present invention are sized to overreach the two widthwise edges of the source interconnect line 41. Thus, when the through holes LP are formed in the repairing thin film parts 20A, the exposed area of the source interconnect lines 41 is made large. This decreases the contact resistance with the repairing conductive film RL formed thereon to improve the reliability of the connection repair.

In the repairing thin film parts 20A, the thickness β of the interlayer insulation film 12 left in the extension parts is made approximately equal to the thickness of the source interconnect line 41. Thus, when the through holes LP are provided in the repairing thin film parts 20A, the upper surface of the interlayer insulation film 12 in the extension parts is substantially flush with the upper surface of the source interconnect line 41, so that the step therebetween is reduced. This provides good coverage of the repairing conductive film RL formed thereon to further improve the reliability of the connection repair.

Also, the extension length α of the extension parts of the repairing thin film parts 20A is not less than the thickness of the interlayer insulation film 12 which is not yet decreased. This achieves further planarization of the upper surface of the interlayer insulation film 12 in the extension parts and the upper surface of the source interconnect line 41 near the edges of the source interconnect line 41 as seen in the direction of the width of the interconnect line to further improve the reliability of the connection repair.

Modifications

Figure 33:
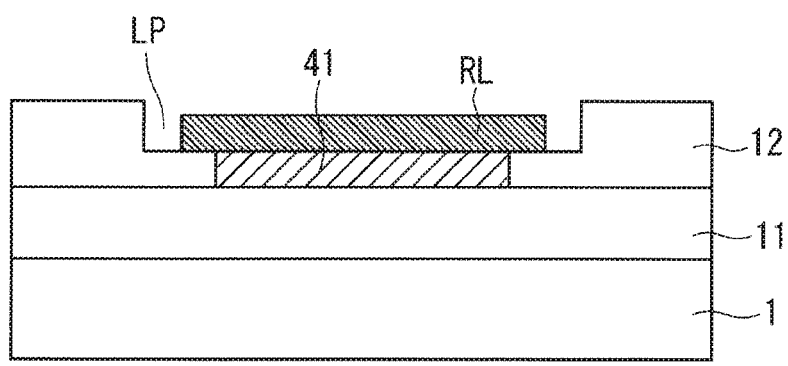
FIG. 33 is a sectional view of the source interconnect line after repair according to the modification of the second preferred embodiment of the present invention.

In the second preferred embodiment described above, the repairing conductive film RL is formed to completely cover the repairing thin film parts 20A, as shown in FIGS. 30 and 31. However, as shown in FIG. 32, the deposition range of the repairing conductive film RL may be decreased so that the repairing thin film parts 20A have portions not covered with the repairing conductive film RL. A cross-sectional configuration taken along the line C-C of FIG. 32 is shown in FIG. 33. As shown in FIG. 33, the upper surface of the source interconnect line 41 is covered with the repairing conductive film RL, but the extension parts of the repairing thin film parts 20A have portions not covered with the repairing conductive film RL.

The decrease in the deposition range of the repairing conductive film RL shortens the time required for the deposition to improve productivity. The width of the repairing conductive film RL may be easily changed by adjusting the width of the variable slit defining the size of the laser light and the energy level of the laser light.

Third Preferred Embodiment

The electronic device according to a third preferred embodiment of the present invention will be described with reference to FIGS. 34 to 38. Only components different from those of the first preferred embodiment will be described, and the common components will not be described.

FIG. 34 is an enlarged view of the source interconnect line 41 including two repairing thin film parts 20B on either side of the broken part BL of the source interconnect line 41 before repair. In FIG. 34, the line C-C traversing one of the repairing thin film parts 20B in the direction of the width of the interconnect line is additionally shown.

As shown in FIG. 34, the repairing thin film parts 20B are sized so that one of the edges thereof extending in a direction orthogonal to the longitudinal direction of the source interconnect line 41 overreaches one of the two widthwise edges of the source interconnect line 41.

Parts of the repairing thin film parts 20A which overreach the widthwise edge of the source interconnect line 41 are referred to as extension parts. In FIG. 34, the length of the extension parts (the dimension of the direction of the width of the interconnect line) is shown as an extension length α. A cross-sectional configuration taken along the line C-C of FIG. 34 is shown in FIG. 35.

Figure 35:
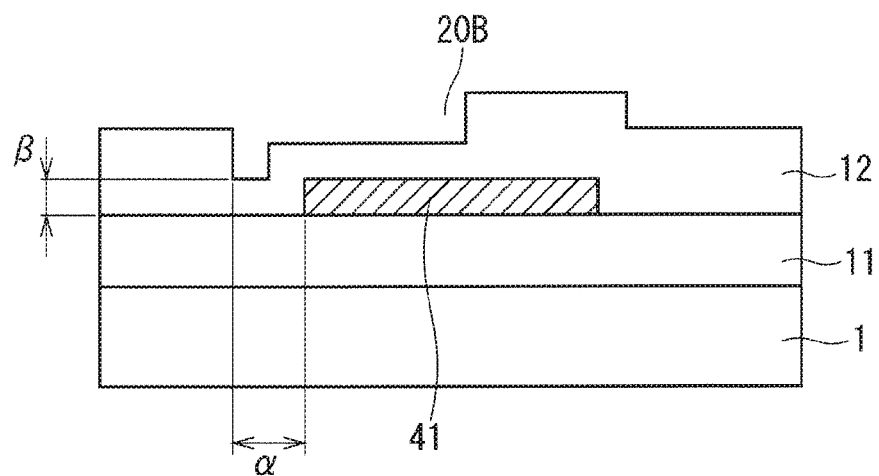
FIGS. 35 and 36 are views illustrating the repair steps according to e third preferred embodiment of the present invention.

In such a repairing thin film part 20B, the thickness of the interlayer insulation film 12 on the source interconnect line 41 is decreased, as shown in FIG. 35. The thickness of the interlayer insulation film 12 is similarly decreased as well in the extension part. The thickness β of the interlayer insulation film 12 left in the extension part is approximately equal to the thickness of the source interconnect line 41. The reason therefor is described in the second preferred embodiment and will not be described in the third preferred embodiment. The stepped part on the periphery of the repairing thin film part 20B, which is formed by a lithography step and an etching step, has good coverage.

Figure 36:
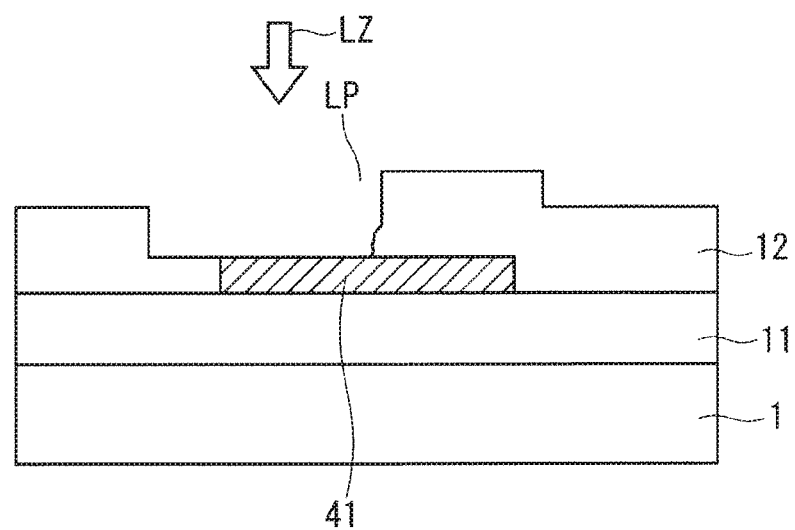

FIG. 36 is a sectional view showing that the source interconnect line 41 is exposed in the bottom of the through hole LP obtained by removing the interlayer insulation film 12 in the repairing thin film part 20B by the zapping method. As shown in FIG. 36, the upper surface of the interlayer insulation film 12 in the extension part of the repairing thin film part 20B and the upper surface of the source interconnect line 41 are substantially flush with each other in the bottom surface of the through hole LP.

Also, the extension length a of the extension part of the repairing thin film part 20B is not less than the thickness of the interlayer insulation film 12 which is not yet decreased. This achieves further planarization of the upper surface of the interlayer insulation film 12 in the extension part and the upper surface of the source interconnect line 41 near the one edge of the source interconnect line 41 as seen in the direction of the width of the interconnect line to further improve the reliability of the connection repair.

Figure 37:
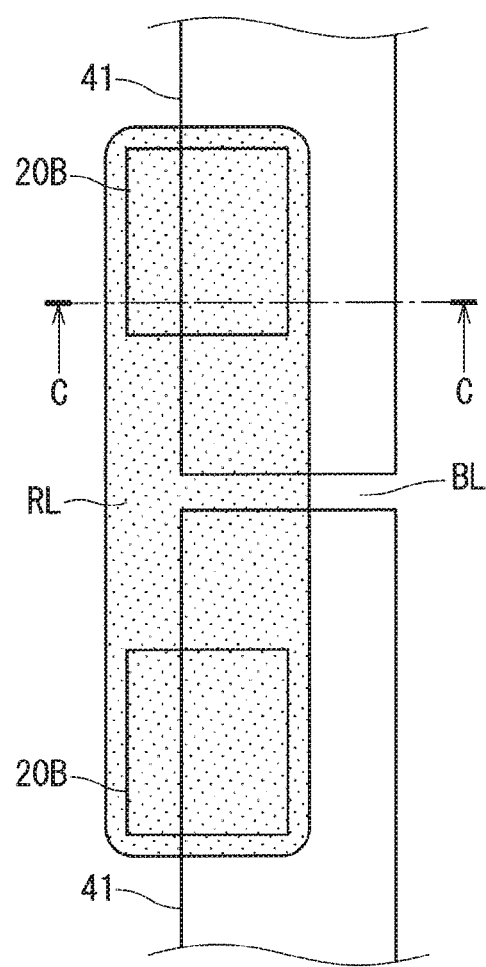
FIG. 37 is a view of the source interconnect line after repair according to the third preferred embodiment of the present invention.

After planarization in the repairing thin film parts 20B, the repairing conductive film RL predominantly made of tungsten excellent in electrical conductivity is formed, as shown in FIG. 37, by means of a laser CVD apparatus so as to extend over the two repairing thin film parts 20B on either side of the broken part BL as in the first preferred embodiment. In this case, the repairing conductive film RL is deposited so as to cover all of the two repairing thin film parts 20B. A cross-sectional configuration taken along the line C-C of FIG. 37 is shown in FIG. 38.

The repairing thin film parts 20B are formed so as to overreach one of the two widthwise edges of the source interconnect line 41. Thus, damages to the source interconnect line 41 which can be caused by laser irradiation for the removal of the interlayer insulation film 12 occurs on only one side of the source interconnect line 41 subjected to the repair connection. In other words, part of the source interconnect line 41 which is not subjected to the repair connection is not damaged. This reduces a likelihood that a break results from damages to the source interconnect line 41 caused by laser irradiation.

In the repairing thin film parts 20B, the thickness β the interlayer insulation film 12 left the extension parts is made approximately equal to the thickness of the source interconnect line 41. Thus, when the through holes LP are provided in the repairing thin film parts 20B, the upper surface of the interlayer insulation film 12 in the extension parts is substantially flush with the upper surface of the source interconnect line 41, so that the step therebetween is reduced. This provides good coverage of the repairing conductive film RL formed thereon to further improve the reliability of the connection repair.

Modifications

Figure 39:
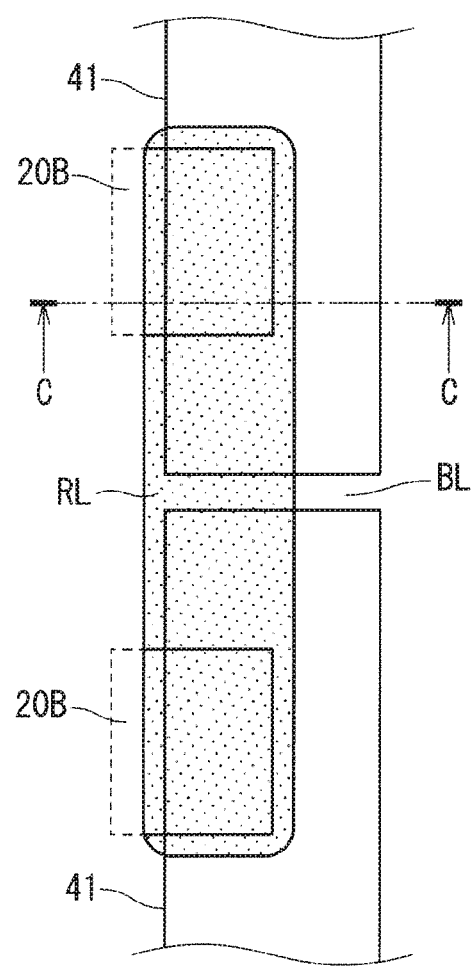
FIG. 39 is a view of the source interconnect line after repair according to a modification of the third preferred embodiment of the present invention.
Figure 40:
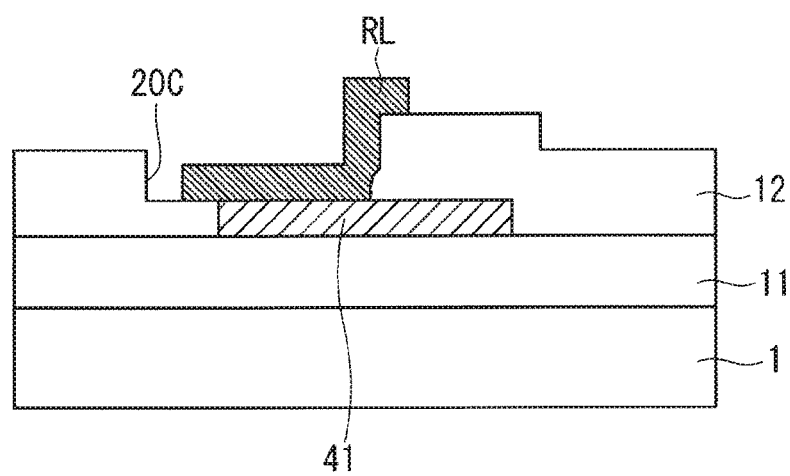
FIG. 40 is a sectional view of the source interconnect line after repair according to the modification of the third preferred embodiment of the present invention.

In the third preferred embodiment described above, the repairing conductive film RL is formed to completely cover the repairing thin film parts 20B, as shown in FIGS. 37 and 38. However, as shown in FIG. 39, the deposition range of the repairing conductive film RL may be decreased so that the repairing thin film parts 20B have portions not covered with the repairing conductive film RL although portions thereof on the source interconnect line 41 are covered with the repairing conductive film RL. A cross-sectional configuration taken along the line C-C of FIG. 39 is shown in FIG. 40. As shown in FIG. 40, the extension parts of the repairing thin film parts 20B have portions not covered with the repairing conductive film RL.

The decrease in the deposition range of the repairing conductive film RL shortens the time required for the deposition to improve productivity.

Fourth Preferred Embodiment

The electronic device according to a fourth preferred embodiment of the present invention will be described with reference to FIGS. 41 to 45. Only components different from those of the first preferred embodiment will be described, and the common components will not be described.

Figure 41:
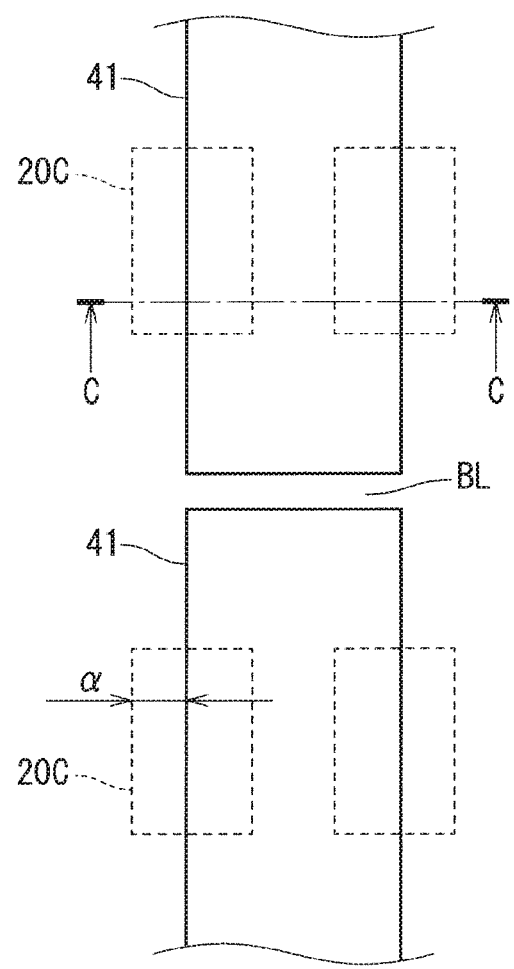
FIG. 41 is a view of the source interconnect line before repair according to a fourth preferred embodiment of the present invention.

FIG. 41 is an enlarged view of the source interconnect lines 41 including four repairing thin film parts 20C on either side of the broken part BL of the source interconnect line 41 before repair. In FIG. 41, the line CC traversing two of the repairing thin film parts 20C in the direction of the width of the interconnect line is additionally shown.

As shown in FIG. 41, two of the repairing thin film parts 20C (first and second thin film parts) provided so as to overreach two respective widthwise edges of the source interconnect line 41 form a pair, and are disposed in spaced apart relation. Two of the repairing thin film parts 20C forming a pair are similarly formed on the opposite side of the broken part BL.

Parts of the individual repairing thin film parts 20C which overreach the widthwise edges of the source interconnect line 41 are referred to as extension parts. In FIG. 41, the length of the extension parts (the dimension of the direction of the width of the interconnect line) is shown as an extension length α. A cross-sectional configuration taken along the line C-C of FIG. 41 is shown in FIG. 42.

Figure 42:
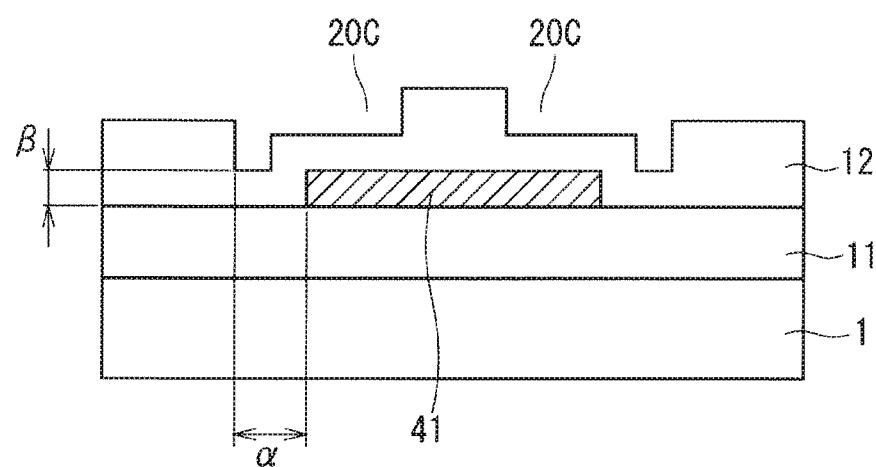
FIGS. 42 and 43 are views illustrating the repair steps according to the fourth preferred embodiment of the present invention.

In such repairing thin film parts 20C, the thickness of the interlayer insulation film 12 on the source interconnect line 41 is decreased, as shown in FIG. 42. The thickness of the interlayer insulation film 12 is similarly decreased as well in the extension parts. The thickness β of the interlayer insulation film 12 left in the extension parts is approximately equal to the thickness of the source interconnect line 41. The reason therefor is described in the second preferred embodiment and will not be described in the fourth preferred embodiment. The stepped part on the periphery of the repairing thin film parts 20C, which is formed by a lithography step and an etching step, has good coverage.

Figure 43:
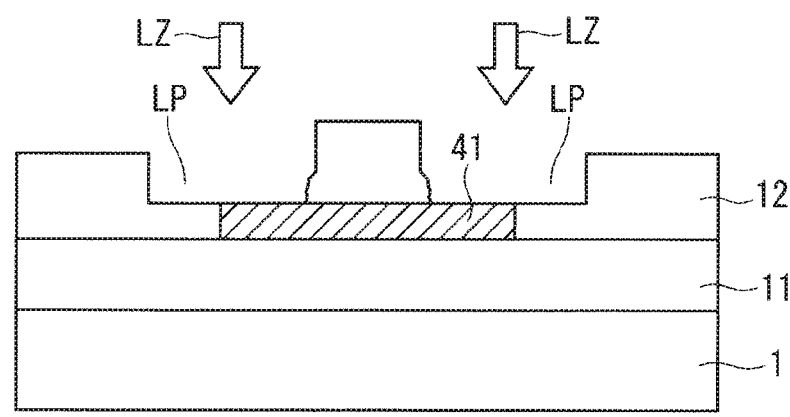

FIG. 43 is a sectional view showing that the source interconnect line 41 is exposed in the bottoms of the through holes LP obtained by removing the interlayer insulation film 12 in the repairing thin film parts 20C by the zapping method. As shown in FIG. 43, the upper surface of the interlayer insulation film 12 in the extension parts of the repairing thin film parts 20C and the upper surface of the source interconnect line 41 are substantially flush with each other in the bottom surfaces of the through holes LP.

Also, the extension length α of the extension parts of the repairing thin film parts 20C is not less than the thickness of the interlayer insulation film 12 which is not yet decreased. This achieves further planarization of the upper surface of the interlayer insulation film 12 in the extension parts and the upper surface of the source interconnect line 41 near one of the edges of the source interconnect line 41 as seen in the direction of the width of the interconnect line to further improve the reliability of the connection repair.

Figure 44:
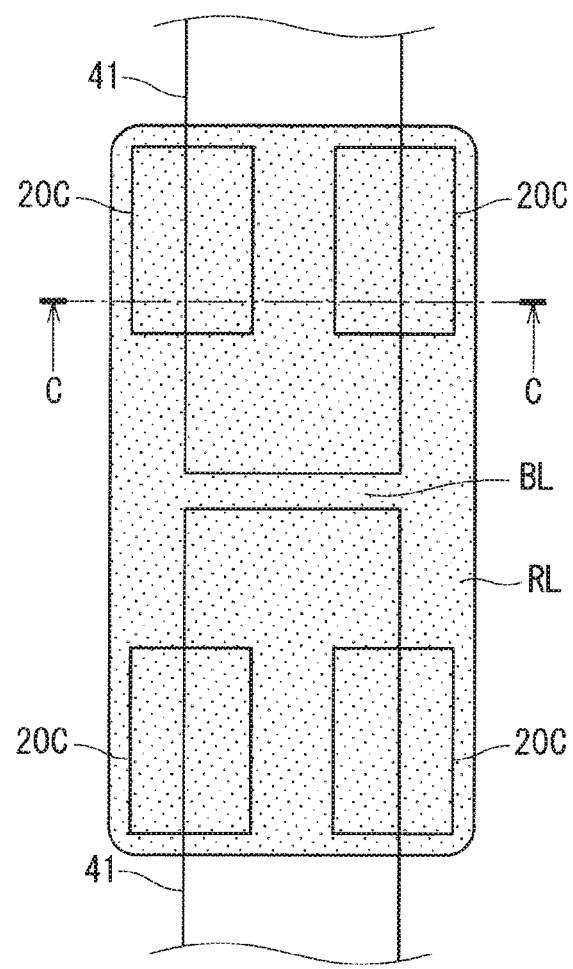
FIG. 44 is a view of the source interconnect line after repair according to the fourth preferred embodiment of the present invention.
Figure 45:
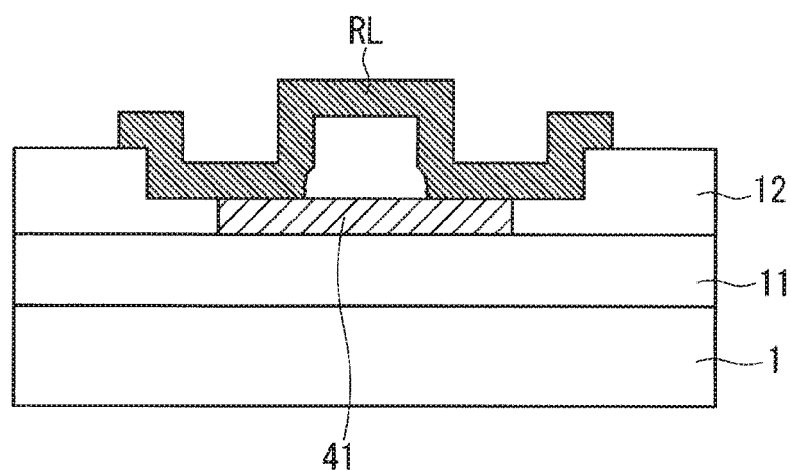
FIG. 45 is a view illustrating the repair steps according to the fourth preferred embodiment of the present invention.

After planarization in the repairing thin film parts 20C, the repairing conductive film RL predominantly made of tungsten excellent in electrical conductivity is formed, as shown in FIG. 44, by means of a laser CVD apparatus so as to extend over the two pairs of repairing thin film parts 20C on either side of the broken part BL as in the first preferred embodiment. In this case, the repairing conductive film RL is deposited so as to cover all of the two pairs of repairing thin film parts 20C. A cross-sectional configuration taken along the line C-C of FIG. 44 is shown in FIG. 45.

Two of the repairing thin film parts 20C provided so as to overreach two respective widthwise edges of the source interconnect line 41 form a pair, and are not disposed in the middle of the source interconnect line 41. That is, the repairing thin film parts 20C are defined so as to leave the interlayer insulation film 12 in the middle of the source interconnect line 41. Thus, damages to the source interconnect line 41 which can be caused by laser irradiation for the removal of the interlayer insulation film 12 occurs on only one side of the source interconnect line 41 subjected to the repair connection. In other words, the middle part of the source interconnect line 41 which is not subjected to the repair connection is not damaged. This reduces a likelihood that a break results from damages to the source interconnect line 41 caused by laser irradiation.

Also, two of the repairing thin film parts 20C form a pair. Thus, the exposed area of the source interconnect lines 41 is made larger as compared with the configuration in which the repairing thin film parts are provided on only one of the two widthwise edges of the source interconnect line 41 such as the repairing thin film parts 20B of the third preferred embodiment. This decreases the contact resistance with the repairing conductive film RL formed thereon to improve the reliability of the connection repair.

In the repairing thin film parts 20C, the thickness β of the interlayer insulation film 12 left in the extension parts is made approximately equal to the thickness of the source interconnect line 41. Thus, when the through holes LP are provided in the repairing thin film parts 20C, the upper surface of the interlayer insulation film 12 in the extension parts is substantially flush with the upper surface of the source interconnect line 41, so that the step therebetween is reduced. This provides good coverage of the repairing conductive film RL formed thereon to further improve the reliability of the connection repair.

Modifications

Figure 46:
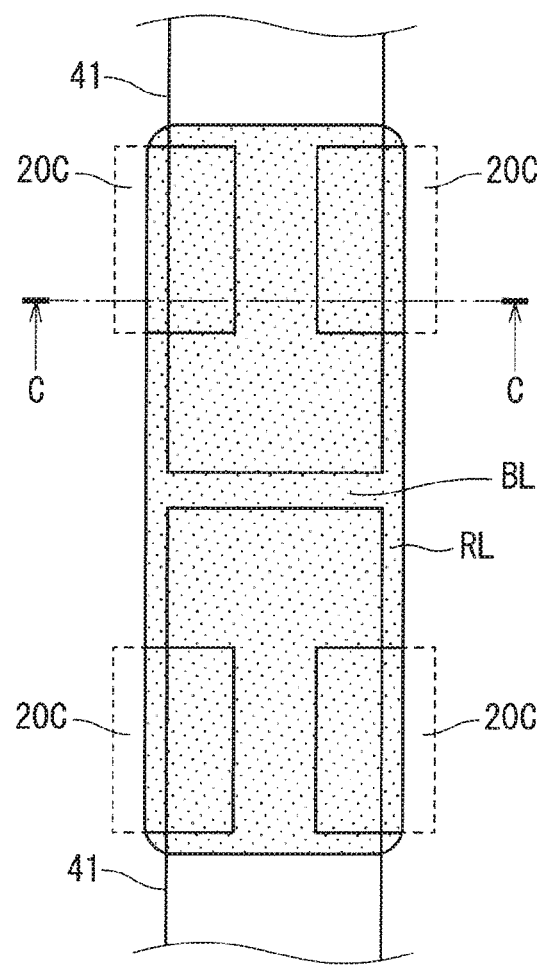
FIG. 46 is a view of the source interconnect line after repair according to a modification of the fourth preferred embodiment of the present invention.
Figure 47:
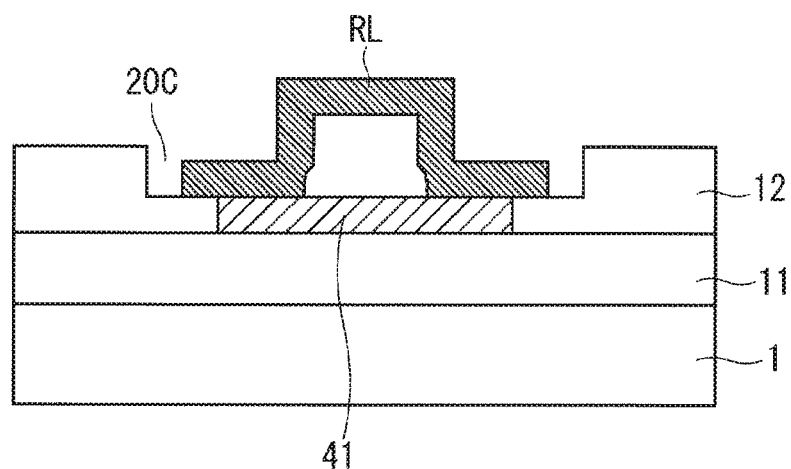
FIG. 47 is a sectional view of the source interconnect line after repair according to the modification of the fourth preferred embodiment of the present invention.

In the fourth preferred embodiment described above, the repairing conductive film RL is formed so as to completely cover the two pairs of repairing thin film parts 20C, as shown in FIGS. 44 and 45. However, as shown in FIG. 46, the deposition range of the repairing conductive film RL may be decreased so that the two pairs of repairing thin film parts 20C have portions not covered with the repairing conductive film RL. A cross-sectional configuration taken along the line C-C of FIG. 46 is shown in FIG. 47. As shown in FIG. 47, the extension parts of the repairing thin film parts 20C have portions not covered with the repairing conductive film RL although portions thereof on the source interconnect line 41 are covered with the repairing conductive film RL. The decrease in the deposition range of the repairing conductive film RL shortens the time required for the deposition to improve productivity.

Fifth Preferred Embodiment

The repair of the source interconnect lines 41 is described in the first to fourth preferred embodiments according to the present invention described above. The present invention, however, is not limited to the application to the repair of the source interconnect lines, but may be applied to the repair of the gate interconnect lines 21.

The electronic device according to a fifth preferred embodiment of the present invention will be described with reference to FIGS. 48 to 53. Only components different from those of the first preferred embodiment will be described, and the common components will not be described.

Figure 48:
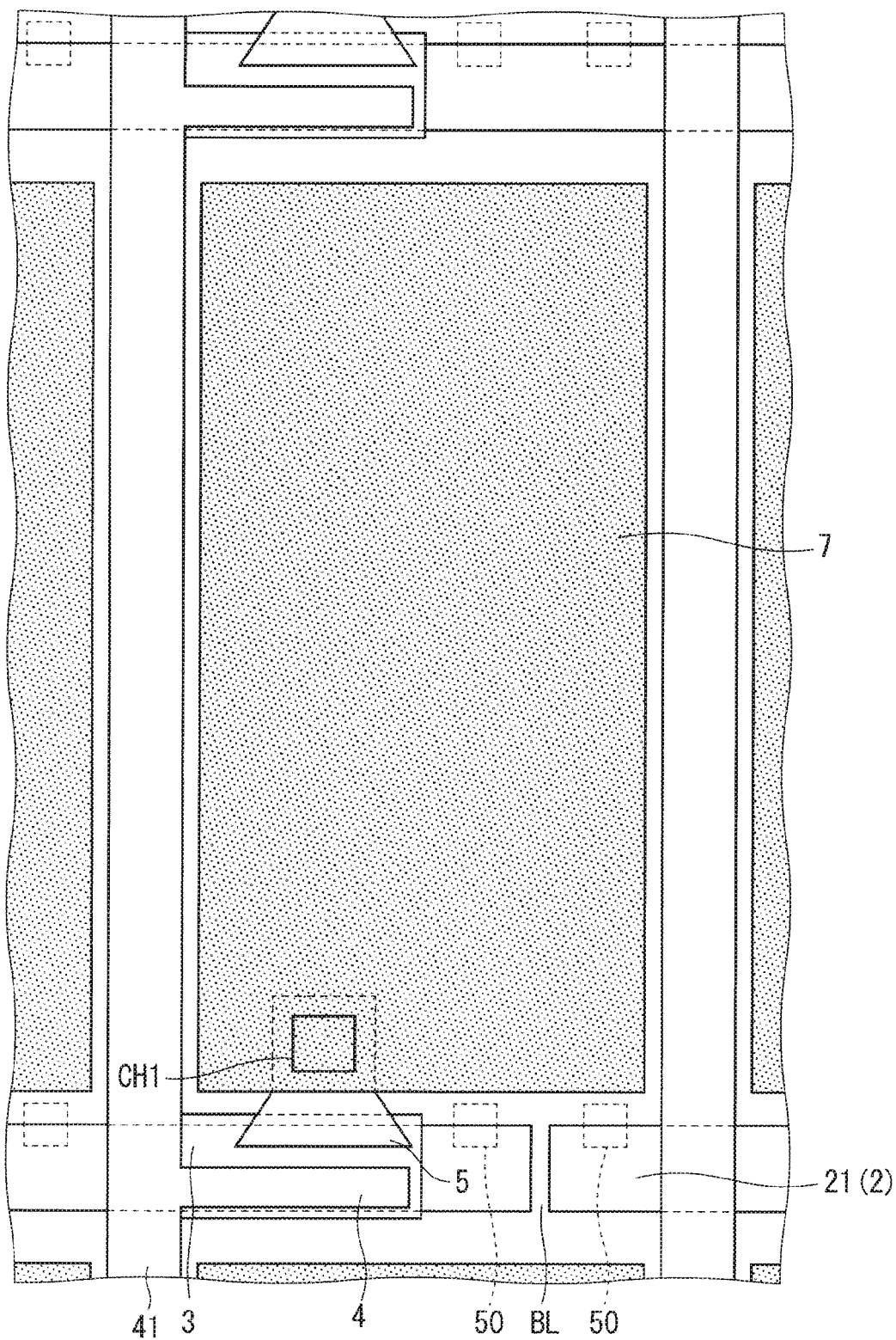
FIG. 48 is a plan view showing the configuration of one pixel part of the liquid crystal display panel according to a fifth preferred embodiment of the present invention.

FIG. 48 is a plan view showing the configuration of one pixel part of a TN type transmissive liquid crystal display panel 200 according to the fifth preferred embodiment, and shows the configuration of the TFT substrate side where the TFTs 30 are arranged in a matrix.

As shown in FIG. 48, the liquid crystal display panel 200 further includes a plurality of repairing thin film parts 50 provided in a multi-layer film comprised of the gate insulation film 11 (not shown) covering the gate interconnect lines 21 and the interlayer insulation film 12 (not shown)

tying on the gate insulation film 11 along the gate interconnect lines 21. An example of break defects produced in a gate interconnect line 21 is shown in FIG. 48, and a broken part BL is formed. This is, however, for the illustration of the repair method according to the present invention, and is not the component of the present invention.

Figure 49:
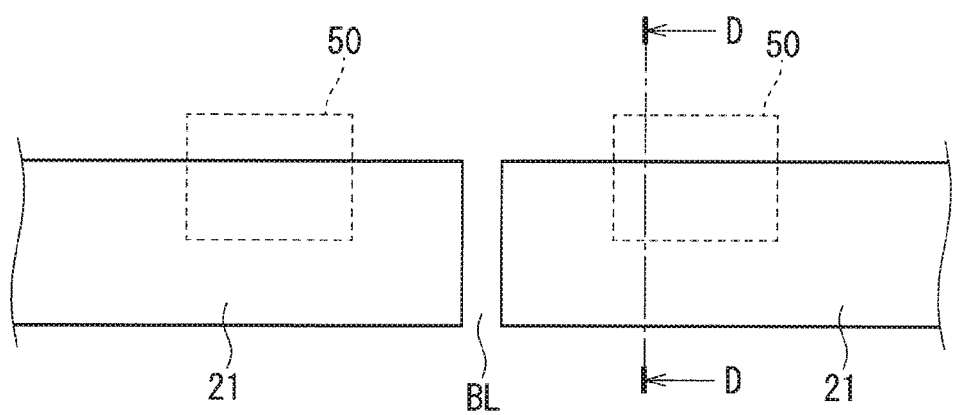
FIG. 49 is a view of the source interconnect line before repair according to the fifth preferred embodiment of the present invention.

FIG. 49 is an enlarged view of the gate interconnect line 21 including two repairing thin film parts 50 on either side of the broken part BL of the gate interconnect line 21 shown in FIG. 48 before repair. In FIG. 49, the line D-D traversing one of the repairing thin film parts 50 in the direction of the width of the interconnect line is additionally shown.

As shown in FIG. 49, the repairing thin film parts 50 are formed so that one of the edges thereof extending in a direction orthogonal to the longitudinal direction of the gate interconnect line 21 overreaches one of the two widthwise edges of the gate et line 21. Parts of the repairing thin film parts 50 which overreach the widthwise edge of the gate interconnect line 21 are referred to as extension parts. A cross-sectional configuration taken along the line D-D of FIG. 49 is shown in FIG. 50.

Such a repairing thin film part 50 extends through the interlayer insulation film 12, and the thickness of the gate insulation film 11 on the gate interconnect line 21 is decreased in the repairing thin film part 50, as shown in FIG. 50, The thickness of the gate insulation film 11 is similarly decreased as well in the extension part. The thickness β of the gate insulation film 11 left in the extension part s approximately equal to the thickness of the gate interconnect line 21. The reason therefor is described in the second preferred embodiment and will not be described in the fifth preferred embodiment. The stepped part on the periphery of the repairing thin film part 50, which is formed by a lithography step and an etching step, has good coverage.

FIG. 51 is a sectional view showing that the gate interconnect line 21 is exposed in the bottom of a through hole LP1 obtained by removing the gate insulation film 11 in the repairing thin film part 50 by the zapping method. As shown in FIG. 51, the upper surface of the gate insulation film 11 in the extension part of the repairing thin film part 50 and the upper surface of the gate interconnect line 21 are substantially flush with each other in the bottom surface of the through hole LP1.

Also, the extension length α of the extension part of the repairing thin film part 50 is not less than the thickness of the gate insulation film 11 which is not yet decreased. This achieves further planarization of the upper surface of the gate insulation film 11 in the extension part and the upper surface of the gate interconnect line 21 near the one edge of the gate interconnect line 21 as seen in the direction of the width of the interconnect line to further improve the reliability of the connection repair.

Figure 52:
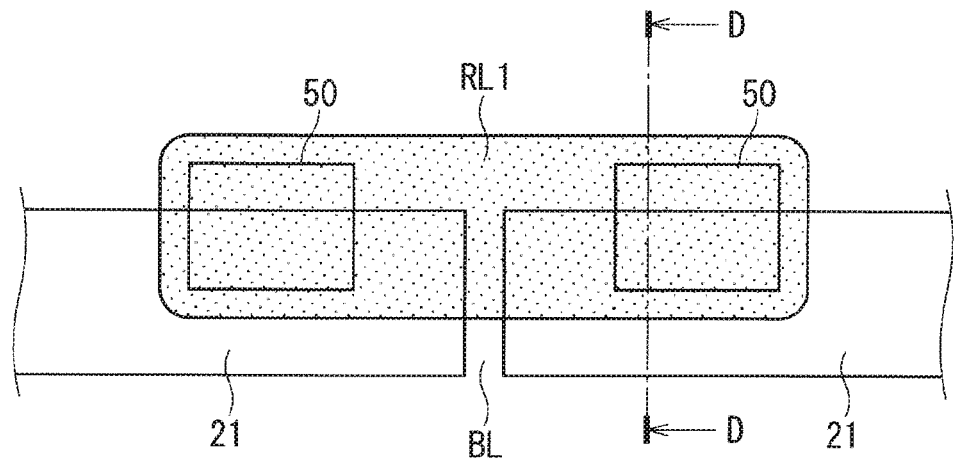
FIGS. 52 and 53 are views of the source interconnect line after repair according to the fifth preferred embodiment of the present invention.
Figure 53:
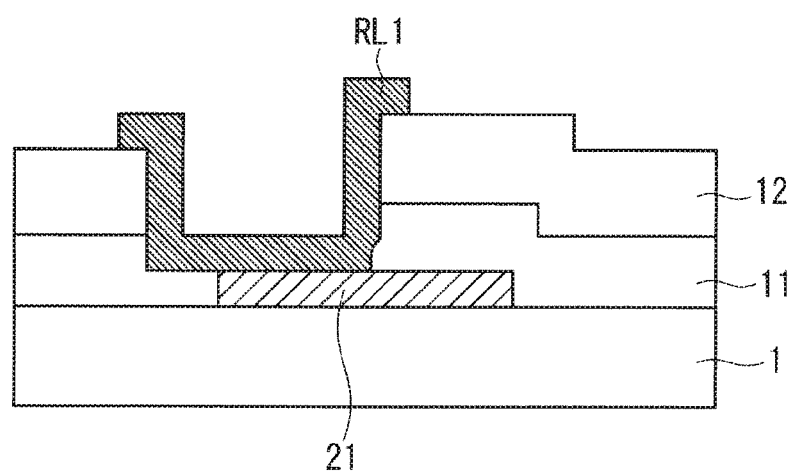

After planarization in the repairing thin film parts 50, a repairing conductive film RL1 predominantly made of tungsten excellent in electrical conductivity is formed, as shown in FIG. 52, by means of a laser CVD apparatus so as to extend over the two repairing thin film parts 50 on either side of the broken part BL as in the first preferred embodiment. In this case, the repairing conductive film RL1 is deposited so as to cover all of the two repairing thin film parts 50. A cross-sectional configuration taken along the line D-D of FIG. 52 is shown in FIG. 53.

The repairing thin film parts 50 are formed so as to overreach one of the two widthwise edges of the gate interconnect line 21. Thus, damages to the gate interconnect line 21 which can be caused by laser irradiation for the removal of the gate insulation film 11 occurs on only one side of the gate interconnect line 21 subjected to the repair connection. In other words, part of the gate interconnect line 21 which is not subjected to the repair connection is not damaged. This reduces a likelihood that a break results from damages to the gate interconnect line 21 caused by laser irradiation.

In the repairing thin film parts 50, the thickness β of the gate insulation film 11 left in the extension parts is made approximately equal to the thickness of the gate interconnect line 21. Thus, when the through holes LP1 are provided in the repairing thin film parts 50, the upper surface of the gate insulation film 11 in the extension parts is substantially flush with the upper surface of the gate interconnect line 21, so that the step therebetween is reduced. This provides good coverage of the repairing conductive film RL1 formed thereon to further improve the reliability of the connection repair.

The multi-layer film comprised of the gate insulation film 11 and the interlayer insulation film 12 is present on the gate interconnect line 21, and the thickness of the multi-layer film is greater than that of the source interconnect line 41. When a conventional laser vaporization method (zapping method) in which laser light irradiation is performed without the provision of the repairing thin film parts 50 is used to remove the insulation film on the irradiated area and to thereby form the through holes, asperities on the inner surfaces of the through holes are larger, so that the cross-sectional shape thereof is more irregular. Thus, the effect of improving the reliability of the connection repair by providing the repairing thin film parts 50 is further higher than the effect of improving the reliability of the connection repair by providing the repairing thin film parts in the interlayer insulation film 12.

Modifications

In the fifth preferred embodiment described above, the repairing thin film parts 50 formed so as to overreach one of the two widthwise edges of the gate interconnect line 21 are provided for the repair of the gate interconnect line 21. The present invention, however, is not limited to this. Similar effects are produced when the configurations of the repairing thin film parts described in the modifications of the first, second and fourth preferred embodiments are applied to the repair of the gate interconnect line.

In the fifth preferred embodiment, the repairing thin film parts are provided only on the gate interconnect line 21. However, as described in the first to fourth preferred embodiments and the modifications thereof, the repairing thin film parts may be provided also on the source interconnect line 41 at the same time to deal with a variety of break defects.

Also, the present invention produces similar effects when applied to the repair of the common interconnect lines and when applied to the repair of terminal interconnect lines.

Exemplary Applications

In the above description, the present invention is applied to the TN type transmissive liquid crystal display devices. However, the present invention may be applied to liquid crystal display devices of IFS (Fringe Field Switching) type, IPS® type, MVA (Multi-domain Vertical Alignment) type and the like. Also, the present invention is not limited to the transmissive liquid crystal display devices, but may be applied to reflective and semi-transmissive liquid crystal display devices. In addition, the present invention may be applied to field sequential type liquid crystal display devices having no color filters. The TFTs according to the present invention are not limited to amorphous silicon TFTs. The present invention may be applied to liquid crystal display devices including polysilicon TFTs, low-temperature polysilicon IFTs and the like.

The application of the present invention is not limited to the liquid crystal display devices. The present invention may be applied to electronic devices having multi-layer interconnection structures such as touch panels and X-ray photodetectors, and produces similar effects when repairing electric interconnect lines.

The above description is the description of an example of the preferred embodiments of the present invention, and the present invention is not limited to the description of the aforementioned preferred embodiments. One skilled in the art will be able to easily change, add and transform the components of the aforementioned preferred embodiments within the scope of the present invention.

Also, the aforementioned preferred embodiments include inventions in various stages, and various inventions can be achieved by appropriately combining a plurality of disclosed components. For example, even if several components are omitted from all of the components illustrated in the preferred embodiments, a configuration in which the several components are omitted can be achieved as an invention as long as the problem as described above can be solved and the effects as described can be obtained.

While the invention has been described in detail, the foregoing description is in all aspects illustrative and not restrictive. It is understood that numerous other modifications and variations can be devised without departing from the scope of the invention.

What is claimed is:

1. An electronic display device having a multi-layer interconnection structure, comprising:
   a foundation layer;
   a plurality of pixels provided in corresponding pixel parts, each pixel having at least one thin film transistor, provided on said foundation layer;
   at least two conductive interconnect lines provided on said foundation layer and formed by depositing a conductor layer and etching the conductor layer, said interconnect lines each having a longitudinally extending part and an end part, said interconnect lines being electrically isolated from each other at least at one end part of each interconnect line by having a gap between adjacent end parts of the respective interconnect lines, the gap being formed at a level of the conductor layer;
   an insulation film formed on said foundation layer and said interconnect lines, the insulation film also being present in the gap between the adjacent end parts of the respective interconnect lines;
   a plurality of holes, each hole formed in the insulation film near a respective end part of each interconnect line that is closest to the gap between the adjacent end parts; and
   a conductive film deposited at least in each hole, and above the insulation film between the end parts of the interconnect lines, thereby electrically connecting the two interconnect lines, wherein
   at least one of the at least two interconnect lines extends from one of the pixel parts to a position outside of the one of the pixel parts, further wherein in plan view, a width of each hole on the end part in a direction orthogonal to the longitudinal direction of the respective extending part of each interconnect line is at least as wide as the width of the respective extending part of each interconnect line.

2. The electronic display device according to claim 1, wherein
   in a region of the interconnect lines, a thickness of the insulation film is greater than a thickness of the interconnect lines.

3. The electronic display device according to claim 2, wherein
   a thickness of the insulation film that exceeds the thickness of the interconnect lines is greater than the thickness of the interconnect lines.

4. The electronic display device according to claim 1, wherein
   in plan view, the width of each hole in the direction orthogonal to the longitudinal direction of the respective extending part of each interconnect line is measured at a distance from the respective end part of the interconnect line of four interconnect line extending part widths.

5. The electronic display device according to claim 1, wherein
   the conductive film comprises indium tin oxide.

6. The electronic display device according to claim 5, wherein
   in a region of the interconnect lines, a thickness of the insulation film is greater than a thickness of the interconnect lines.

7. The electronic display device according to claim 6, wherein
   a thickness of the insulation film that exceeds the thickness of the interconnect lines is greater than the thickness of the interconnect lines.

8. The electronic display device according to claim 5, wherein
   in plan view, a width of each hole in the direction orthogonal to the longitudinal direction of the respective extending part of each interconnect line is at least as wide as the width of the respective interconnect line extending part.

9. The electronic display device according to claim 8, further wherein
   in plan view, the width of each hole in the direction orthogonal to the longitudinal direction of the respective extending part of each interconnect line is measured at a distance from the respective end part of the interconnect line of four interconnect line extending part widths.

10. An electronic display device having a multi-layer interconnection structure, comprising:
    a foundation layer;
    a plurality of pixels provided in corresponding pixel parts, each pixel having at least one thin film transistor, provided on said foundation layer;
    at least two conductive interconnect lines provided on said foundation layer and formed by depositing a conductor layer and etching the conductor layer, said interconnect lines each having a longitudinally extending part and an end part, said interconnect lines being electrically isolated from each other at least at one end part of each interconnect line by having a gap between adjacent end parts of the respective interconnect lines, the gap being formed at a level of the conductor layer;
    an insulation film formed on said foundation layer and said interconnect lines, the insulation film also being present in the gap between the adjacent end parts of the respective interconnect lines;

a plurality of holes, each hole formed in the insulation film near a respective end part of each interconnect line that is closest to the gap between the adjacent end parts; and a conductive film deposited at least in each hole, and above the insulation film between the ends of the interconnect lines, thereby electrically connecting the two interconnect lines, wherein at least one of the at least two interconnect lines extends to connect to a TFT terminal, further wherein in plan view, a width of each hole on an end part in a direction orthogonal to the longitudinal direction of the respective extending part of each interconnect line is at least as wide as the width of the respective extending part of each interconnect line.

11. The electronic display device according to claim 10, wherein in plan view, a width of each hole in a direction orthogonal to the longitudinal direction of the respective extending part of each interconnect line is at least as wide as the width of the respective interconnect line extending part.

12. The electronic display device according to claim 11, wherein the conductive film comprises indium tin oxide.

13. The electronic display device according to claim 10, wherein the conductive film comprises indium tin oxide.

14. An electronic display device having a multi-layer interconnection structure, comprising:

a foundation layer;

a plurality of pixels provided in corresponding pixel parts, each pixel having at least one thin film transistor, provided on said foundation layer;

at least two conductive interconnect lines provided on said foundation layer and formed by depositing a conductor layer and etching the conductor layer, said interconnect lines each having a longitudinally extending part and an end part, said interconnect lines being electrically isolated from each other at least at one end part of each interconnect line by having a gap between adjacent end parts of the respective interconnect lines, the gap being formed at a level of the conductor layer;

an insulation film formed on said foundation layer and said interconnect lines, the insulation film also being present in the gap between the adjacent end parts of the respective interconnect lines;

a plurality of holes, each hole formed in the insulation film near a respective end part of each interconnect line that is closest to the gap between the adjacent end parts; and a conductive film deposited at least in each hole, and above the insulation film between the ends of the interconnect lines, thereby electrically connecting the two interconnect lines, wherein at least one of the at least two interconnect lines extends to connect to a TFT terminal, further wherein each end part of each respective interconnect line includes a plurality of connection holes.

15. The electronic display device according to claim 14, wherein in plan view, a width of each hole in a direction orthogonal to a longitudinal direction of the respective extending part of each interconnect line is at least as wide as the width of the respective interconnect line extending part.

16. The electronic display device according to claim 15, wherein the conductive film comprises indium tin oxide.

17. The electronic display device according to claim 14, wherein the conductive film comprises indium tin oxide.

* * * * *